United States Patent
Nada et al.

(10) Patent No.: US 6,825,143 B2
(45) Date of Patent: Nov. 30, 2004

(54) METHOD OF MAKING LEAD ZIRCONATE TITANATE-BASED CERAMIC POWDER, PIEZOELECTRIC CERAMIC AND METHOD FOR MAKING SAME, AND PIEZOELECTRIC CERAMIC ELEMENT

(75) Inventors: Kenichi Nada, Shiga-ken (JP); Kazunari Okada, Shiga-ken (JP); Masataka Kida, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 5 days.

(21) Appl. No.: 10/240,845

(22) PCT Filed: Feb. 5, 2002

(86) PCT No.: PCT/JP02/00926

§ 371 (c)(1),
(2), (4) Date: Oct. 4, 2002

(87) PCT Pub. No.: WO02/062724

PCT Pub. Date: Aug. 15, 2002

(65) Prior Publication Data

US 2003/0096696 A1 May 22, 2003

(30) Foreign Application Priority Data

Feb. 8, 2001 (JP) ........................................ 2001-032862
Nov. 29, 2001 (JP) ........................................ 2001-364272

(51) Int. Cl.$^7$ .......................................... C04B 35/491
(52) U.S. Cl. ..................................................... 501/134
(58) Field of Search ......................................... 501/134

(56) References Cited

U.S. PATENT DOCUMENTS 5,965,057 A * 10/1999 Hase et al. ............ 252/62.9 PZ
6,207,069 B1 * 3/2001 Furukawa et al. .... 252/62.9 PZ
6,322,718 B1 * 11/2001 Dai et al. .............. 252/62.9 PZ
6,391,814 B1 * 5/2002 Tsubokura et al. ........... 501/136

OTHER PUBLICATIONS

Tapoanoi et al, "Piezoelectric Properties . . . " Jpn. J. Appl. Phys. vol. 33, pp5336–5340 (Sep. 1994).*

Lucuta et al, "Structural Dependence on Sintering Temperatures . . . ", J. Am. Ceram. Soc., 68(10) 533–37, (1985).*

* cited by examiner

Primary Examiner—David Brunsman
(74) Attorney, Agent, or Firm—Dickstein, Shapiro, Morin & Oshinsky, LLP.

(57) ABSTRACT

The present invention relates to a method for producing a lead zirconate titanate-based ceramic powder containing uniform, fine lead zirconate titanate, using a solid-phase method. The method includes the steps of mixing a lead oxide powder, a zirconium oxide powder, and a titanium oxide powder to form a mixed base powder; and heat-treating the mixed base powder so that lead oxide in the lead oxide powder and titanium oxide in the titanium oxide powder react to produce lead titanate, and that unreacted lead oxide not used in the reaction, the lead titanate produced by the reaction, and zirconium oxide in the zirconium oxide powder react to produce the lead zirconate titanate-based ceramic powder containing lead zirconate titanate.

16 Claims, 13 Drawing Sheets

METHOD OF MAKING LEAD ZIRCONATE TITANATE-BASED CERAMIC POWDER, PIEZOELECTRIC CERAMIC AND METHOD FOR MAKING SAME, AND PIEZOELECTRIC CERAMIC ELEMENT

BACKGROUND OF THE INVENTION

1. Technical Field

The present invention relates to methods for making lead zirconate titanate-based ceramic powders containing lead zirconate titanate, methods for producing piezoelectric ceramics using the same, piezoelectric ceramics produced by the methods, and piezoelectric ceramic elements.

2. Background Art

Piezoelectric ceramics, which have been used for piezoelectric ceramic elements, such as actuators and transformers, are produced using, as raw materials, lead zirconate titanate-based ceramic powders containing as a principal constituent lead zirconate titanate having a large electromechanical coefficient.

In order to synthesize a lead zirconate titanate-based ceramic powder, a so-called solid-phase method is employed in which a lead oxide (PbO) powder, a zirconium oxide ($ZrO_2$) powder, and a titanium oxide ($TiO_2$) powder are weighed, mixed, and pulverized, and then heat treatment is performed.

During the heat treatment, first, from approximately 500° C., lead oxide in the lead oxide powder reacts with titanium oxide in the titanium oxide powder to produce lead titanate ($PbTiO_3$), and simultaneously (strictly speaking, from approximately 600 to 700° C., when lead titanate is in the process of being generated), lead oxide in the lead oxide powder reacts with zirconium oxide in the zirconium oxide powder to produce lead zirconate ($PbZrO_3$). From approximately 800 to 1,000° C., the lead titanate and lead zirconate react to produce lead zirconate titanate ($Pb(Zr,Ti)O_3$).

However, in the heat treatment step described above, in order to obtain lead zirconate titanate having a uniform crystal structure by the reaction of lead zirconate and lead titanate, the produced lead zirconate and lead titanate must be dissolved and made to react homogeneously. That is, once lead zirconate is produced, since the production/dissolution temperature of lead zirconate is high, the synthesis temperature of lead zirconate titanate is increased. If the synthesis temperature is increased, grain growth of lead zirconate titanate grains in the lead zirconate titanate-based ceramic-powder is accelerated, and the grains are coarsened. As a result, since the reactivity of the lead zirconate titanate grains is decreased, when a piezoelectric ceramic is produced by firing the lead zirconate titanate-based ceramic powder, the sintering temperature thereof is increased. If the sintering temperature is increased, the lead component is partially volatilized, and the composition ratio of the resultant sintered compact (piezoelectric ceramic) can easily vary.

The present inventor has disclosed a technique in Japanese Unexamined Patent Application Publication No. 5-306122 in which for the purpose of low-temperature synthesis of a lead zirconate titanate-based ceramic powder, by mixing a fine powder of a monodisperse compound oxide obtained by hydrolysis of alkoxides of constituent elements except lead with a lead oxide powder, followed by heat treatment, a lead zirconate titanate-based ceramic powder can be directly obtained without generating an intermediate compound.

However, in the method in which alkoxides are used as starting materials, the process is complex and troublesome, and the cost of the starting materials themselves is high, so that this method is not ideal for commercial production.

SUMMARY OF THE INVENTION

The present invention has been achieved in view of the situation described above, and with the invention it is possible to produce a lead zirconate titanate-based ceramic powder having a uniform, fine crystal structure using a solid-phase method in which a heat treatment temperature is kept low. The present invention is also usable to produce a piezoelectric ceramic of stable quality with less variation in its composition ratio by processing at a low firing temperature, and to provide a piezoelectric ceramic element using the piezoelectric ceramic.

That is, the present invention relates to a method for producing a lead zirconate titanate-based ceramic powder which includes the steps of mixing a lead oxide powder, a zirconium oxide powder, and a titanium oxide powder to form a mixed base powder; and heat-treating the mixed base powder so that lead oxide in the lead oxide powder and titanium oxide in the titanium oxide powder react to produce lead titanate, and that unreacted lead oxide not used in the reaction, the lead titanate produced by the reaction, and zirconium oxide in the zirconium oxide powder react to produce the lead zirconate titanate-based ceramic powder containing lead zirconate titanate. (Hereinafter, this method for producing the lead zirconate titanate-based ceramic powder may be referred to as "a first production method of the present invention".)

The present invention also relates to a method for producing a lead zirconate titanate-based ceramic powder which includes a first step of mixing and heat-treating a lead oxide powder and a titanium oxide powder so that lead oxide in the lead oxide powder and titanium oxide in the titanium oxide powder react to produce a lead titanate-based powder containing lead titanate; and a second step of mixing and heat-treating the lead titanate-based powder, another lead oxide powder, and a zirconium oxide powder so that lead titanate in the lead titanate-based powder, lead oxide in the other lead oxide powder, and zirconium oxide in the zirconium oxide powder react to produce the lead zirconate titanate-based ceramic powder containing lead zirconate titanate. (Hereinafter, this method for producing the lead zirconate titanate-based ceramic powder may be referred to as "a second production method of the present invention".)

In accordance with the first or second production method of the present invention, in the heat-treating step for synthesizing lead zirconate titanate, it is possible to suppress the generation of lead zirconate which requires a high-temperature heat treatment, so that the heat-treating temperature required for producing a lead zirconate titanate-based ceramic powder can be kept low. Therefore, the resultant lead zirconate titanate-based ceramic powder has a uniform, fine crystal structure (grain structure) and has superior reactivity. When the lead zirconate titanate-based ceramic powder is used for a piezoelectric ceramic, the amount of unreacted lead oxide being present at the grain boundaries can be decreased.

The present invention further provides a method for making a piezoelectric ceramic using the first production method of the present invention, which includes the steps of: mixing a lead oxide powder, a zirconium oxide powder, and a titanium oxide powder to form a mixed base powder; heat-treating the mixed base powder so that lead oxide in the lead oxide powder and titanium oxide in the titanium oxide powder react to produce lead titanate, and that unreacted lead oxide not used in the reaction, the lead titanate produced by the reaction, and zirconium oxide in the zirconium oxide powder react to produce a lead zirconate titanate-based ceramic powder containing lead zirconate titanate; and forming the lead zirconate titanate-based ceramic powder into a predetermined shape and firing the resultant green compact.

The present invention also provides a method for making a piezoelectric ceramic using the second production method of the present invention, which includes: a first step of mixing and heat-treating a lead oxide powder and a titanium oxide powder so that lead oxide in the lead oxide powder and titanium oxide in the titanium oxide powder react to produce a lead titanate-based powder containing lead titanate; a second step of mixing and heat-treating the lead titanate-based powder, another lead oxide powder, and a zirconium oxide powder so that lead titanate in the lead titanate-based powder, lead oxide in the lead oxide powder, and zirconium oxide in the zirconium oxide powder react to produce a lead zirconate titanate-based ceramic powder containing lead zirconate titanate; and a third step of forming the lead zirconate titanate ceramic powder into a predetermined shape and firing the resultant green compact.

In accordance with each of the methods for making the piezoelectric ceramic, in the step of synthesizing lead zirconate titanate, the generation of lead zirconate can be suppressed, whereby the heat-treating temperature required for producing the lead zirconate titanate-based ceramic powder can be kept low. Furthermore, since the lead zirconate titanate-based ceramic powder has a uniform, fine crystal structure, its reactivity is improved. That is, when the piezoelectric ceramic is formed using the ceramic powder, the firing temperature can be kept low, and the amount of unreacted lead oxide being present at the grain boundaries of the resultant piezoelectric ceramic can be decreased. That is, it is possible to obtain the piezoelectric ceramic which has little variation in its composition ratio, stable quality, and a large electromechanical coefficient.

The present invention also provides a piezoelectric ceramic produced by the method for making the piezoelectric ceramic of the present invention, and furthermore, the present invention provides a piezoelectric ceramic element including the piezoelectric ceramic of the present invention and electrodes provided therewith.

In the piezoelectric ceramic obtained by such a production method, the content of unreacted Pb is low, and when the piezoelectric ceramic is used for a piezoelectric element, the piezoelectric characteristics can be greatly improved. In the piezoelectric ceramic element using the piezoelectric ceramic, the piezoelectric characteristics according to the piezoelectric ceramic element can be greatly improved.

Other features and advantages of the present invention will become apparent from the following description of examples of the invention which refers to the accompanying drawings.

BEST MODE FOR CARRYING OUT THE INVENTION

Figure 1:
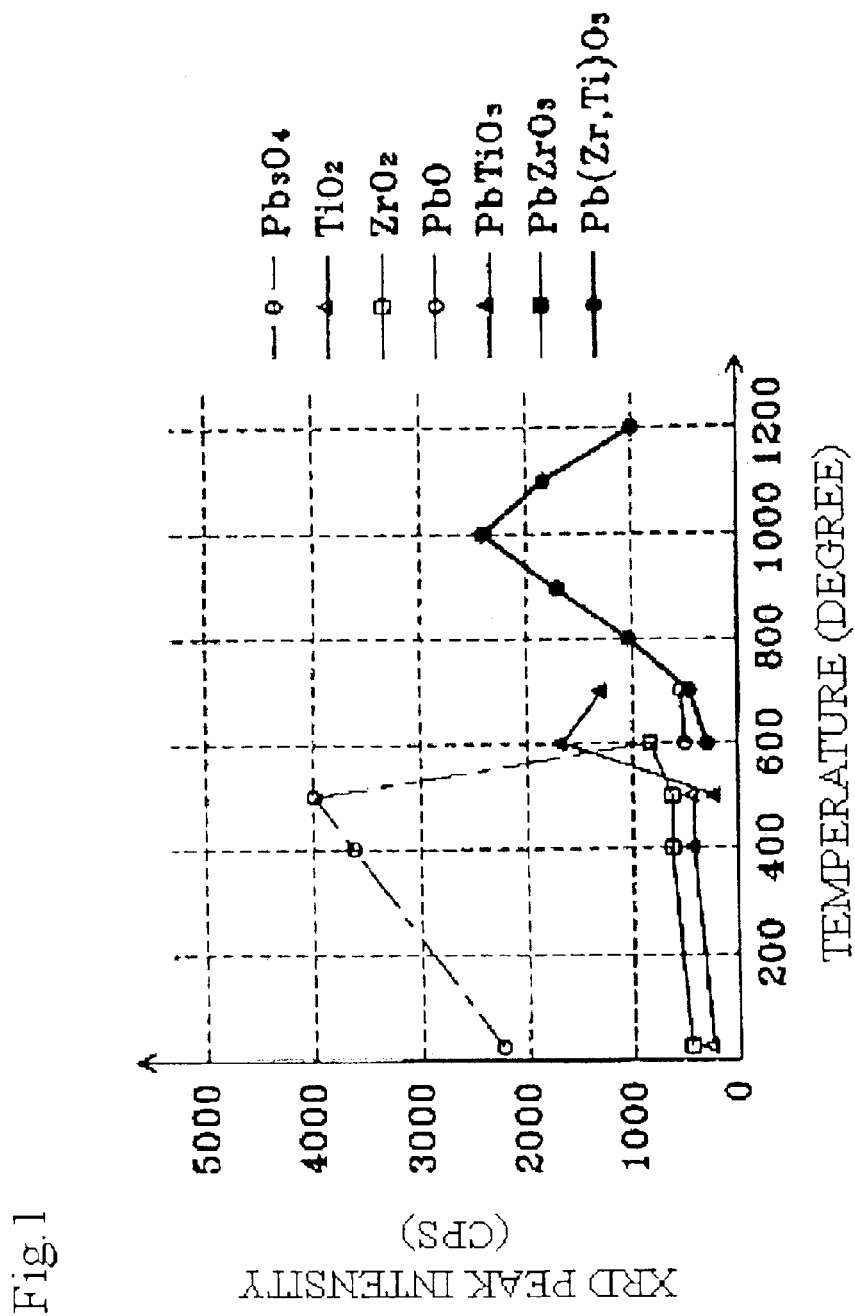
FIG. 1 is a graph showing the XRD peak intensity ratio of the individual compounds in Example 1 in the lead zirconate titanate synthesis process.

In the first and second production methods and the methods for making piezoelectric ceramics of the present invention, when lead zirconate titanate is synthesized using a mixed base powder containing a lead oxide powder, a titanium oxide powder, and a zirconium oxide powder (hereinafter, the mixed base powder may be referred to as "a piezoelectric material"), a reaction process is used in which, mainly, lead oxide and titanium oxide are made to react to synthesize lead titanate, and lead titanate, lead oxide, and zirconium oxide are caused to react to synthesize lead zirconate titanate. Thereby, the generation of lead zirconate is suppressed until lead zirconate titanate is synthesized.

In particular, in the first production method of the present invention, by selecting a titanium oxide powder which is highly reactive to lead oxide and by selecting a zirconium oxide powder which is not very reactive to lead oxide, lead oxide and titanium oxide can be preferentially reacted with each other, and furthermore, since the resultant lead titanate is made to react with unreacted lead oxide, which is not used for the synthesis reaction of lead titanate, and zirconium oxide, which is not substantially related to the synthesis reaction of lead titanate, the generation of lead zirconate can be substantially suppressed in a series of reaction systems. In the second production method of the present invention, in the first step, zirconium oxide is not used, and since lead titanate produced in the first step is made to react with lead oxide and zirconium oxide in the second step, the generation of lead zirconate can be substantially suppressed in a series of reaction systems.

Additionally, in either production method, it is not necessary to completely suppress the generation of lead zirconate, and sufficient effects can be achieved even if a slight amount of lead zirconate is generated. The slight amount means that when the XRD peak intensity of the pyrochlore phase and the XRD peak intensity of lead zirconate titanate are simultaneously measured with an XRD analyzer in the lead zirconate titanate synthesis process, the XRD peak intensity of lead zirconate is approximately 0.4 or less times the XRD peak intensity of lead zirconate titanate. That is, during the lead zirconate titanate synthesis, in the heat-treating step, if the XRD peak intensity of lead zirconate is 0.4 times or less, and more preferably, 0.2 times or less, the XRD peak intensity of lead zirconate titanate, a substantial influence (such as an increase in synthesis temperature) of lead zirconate can be avoided.

In the present invention, although examples of lead oxide powders include PbO and $Pb_3O_4$, the present invention is not limited thereto, and any powder containing lead oxide is acceptable.

In the present invention, although the titanium oxide powder may be mainly mentioned as being a $TiO_2$ powder, the present invention is not limited thereto, and any powder containing titanium oxide is acceptable. Additionally, in order to improve the piezoelectric characteristics of the resultant piezoelectric ceramic, the specific surface area is preferably 5 $m^2/g$ or more. In the case of the titanium oxide powder used in the first production method, a titanium oxide powder which is more reactive than the zirconium oxide powder, and in particular, which is highly reactive to the lead oxide powder, is preferably used.

In the present invention, although the zirconium oxide powder may be mainly mentioned as being a $ZrO_2$ powder, the present invention is not limited thereto, and any powder containing zirconium oxide is acceptable. Additionally, in order to improve the piezoelectric characteristics of the resultant piezoelectric ceramic, the specific surface area is preferably 1 $m^2/g$ or more. In the case of the zirconium oxide powder used in the first production method, a zirconium oxide powder which is less reactive than the titanium oxide powder, and in particular, which is less reactive to the lead oxide powder than titanium oxide, is preferably used.

In the first production method of the present invention, preferably, a zirconium oxide powder and a titanium oxide powder satisfying the expression, $y \geq 1.218 e^{0.117x}$ ($x \geq 1$), where x is the specific surface area ($m^2/g$) of the zirconium oxide powder and y is the specific surface area ($m^2/g$) of the titanium oxide powder, are used as the zirconium oxide powder and the, titanium oxide powder.

By selecting such a specific surface area relationship between the titanium oxide powder and the zirconium oxide powder, since the reactivity of the titanium oxide powder to lead oxide can be increased compared to the reactivity of the zirconium oxide powder to lead oxide at the ordinary pulverizing/mixing level, even if the lead oxide powder, the titanium oxide powder, and the zirconium oxide powder are simultaneously supplied for reaction, the generation of lead zirconate can be suppressed. That is, lead titanate is synthesized first, and then the generation of lead titanate zirconate starts before lead zirconate begins to be generated, and consequently, the generation of lead zirconate is suppressed.

In the first production method of the present invention, before the mixed base powder including the lead oxide powder, the titanium oxide powder, and the zirconium oxide powder is heat-treated, preferably, the mixed base powder is pulverized so that the specific surface area after pulverization is 1.4 or more times the specific surface area before pulverization. That is, the specific surface area before pulverization of the piezoelectric material comprising the lead oxide powder, titanium oxide powder, and zirconium oxide powder is considered as a reference, and by setting the specific surface area of the piezoelectric material after pulverization to be 1.4 or more times the reference, the reactivity of the titanium oxide powder to lead oxide can be increased relative to the reactivity of the zirconium oxide powder to lead oxide, and therefore, even if the lead oxide powder, the titanium oxide powder, and the zirconium oxide powder are simultaneously supplied for reaction, the generation of lead zirconate can be further suppressed. The reason for this is believed to be that since the titanium oxide powder is more easily pulverized compared to the zirconium oxide powder, by pulverizing the piezoelectric ceramic material to the extent so as to satisfy the range described above, a difference in reactivity is produced between the titanium oxide powder and the zirconium oxide powder.

Herein, the specific surface area refers to the value calculated based on the equation below.

Specific surface area of piezoelectric ceramic material=(Specific surface area of lead oxide powder×Weight ratio)+(Specific surface area of titanium oxide powder×Weight ratio)+(Specific surface area of zirconium oxide powder×Weight ratio)+(Specific surface area of other starting materials× Weight ratio)     Equation I In the first production method of the present invention, before the mixed base powder (i.e., piezoelectric material) is heat-treated, preferably, a niobium oxide powder is added to the mixed base powder. In the second production method of the present invention, in the first step, preferably, a niobium oxide powder is mixed together with the lead oxide powder and the titanium oxide powder, and in the second step, a niobium oxide powder may be mixed together with the lead titanate-based powder, the lead oxide powder, and the zirconium oxide powder.

Consequently, the firing temperature required for obtaining the piezoelectric ceramic can be kept low, the amount of unreacted lead oxide being present at the grain boundaries can be decreased when the lead zirconate titanate-based ceramic powder is used for a piezoelectric ceramic, and also it is possible to produce a piezoelectric ceramic which has superior piezoelectric characteristics, and particularly, has a high electromechanical coefficient, a high mechanical quality factor, and a high Curie point.

In the piezoelectric ceramic having a perovskite-type structure represented by $ABO_3$ as the principal crystal structure, when a niobium element is included in the principal crystal structure, except for the case in which the B-site element is calcined in advance, the lead element and the niobium element in the starting materials are selectively made to react to produce a pyrochlore phase. Although the pyrochlore phase may influence various characteristics of the piezoelectric ceramic, according to the first and second production methods of the present invention, the influence of the pyrochlore phase on the piezoelectric ceramic can also be decreased.

That is, when a ceramic powder, in which the pyrochlore phase and the perovskite phase comprising lead titanate zirconate are mixed, is formed into a predetermined shape and fired, since the shrinkage percentage differs between the pyrochlore phase and the perovskite phase, cracking may occur in the resultant sintered compact. In contrast, in accordance with the production methods described above, the pyrochlore phase can be decreased to such an extent that no problem is caused by the time the temperature reaches the level in which the perovskite phase is generated, and thereby, it is possible to prevent the pyrochlore phase and the perovskite phase from being mixed. Consequently, it is possible to obtain a dense piezoelectric ceramic in which cracking does not occur in the exterior of the sintered compact.

Additionally, in the first production method of the present invention, the heat-treating step and the firing step may be performed continuously. In such a case, a binder is preliminarily added to the mixed base powder (piezoelectric ceramic material) including the lead oxide powder, the titanium oxide powder, and zirconium oxide powder, and after a desired shape is formed, heat treatment is performed to synthesize the lead zirconate titanate-based ceramic, and then firing is performed.

The method for making a piezoelectric ceramic of the present invention can be also applied to a ternary system piezoelectric ceramic in which a perovskite-type compound oxide is dissolved as a third component, in addition to the binary system $Pb(Tr,Ti)O_3$-based piezoelectric ceramic. Examples of ternary system piezoelectric ceramics include, but are not limited to, $Pb(Mn_{1/3}Sb_{2/3})(Zr,Ti)O_3$-based ceramics and $Pb(Co_{1/2}W_{1/2})(Zr,Ti)O_3$-based ceramics. As necessary, some of the Pb may be replaced with Sr, Ba, La, Ca, or the like, or $SiO_2$, $Al_2O_3$, or the like may be added.

Nb may be added as an additive or may be added as a third component in a perovskite-type compound oxide. In such a case, as the third component in the perovskite-type compound oxide, for example, a $Pb(Mg_{1/3}Nb_{2/3})(Zr,Ti)O_3$-based ceramic, a $Pb(Mn_{1/3}Nb_{2/3})(Zr,Ti)O_3$-based ceramic, or a $Pb(Co_{1/3}Nb_{2/3})(Zr,Ti)O_3$-based ceramic may be used, and the piezoelectric ceramic thus obtained has particularly superior piezoelectric characteristics.

EXAMPLES

Methods for making piezoelectric ceramics of the present invention will be described in detail based on the examples below.

Example 1

As starting materials, a lead oxide powder ($Pb_3O_4$: specific surface area 2 $m^2/g$), a titanium oxide powder ($TiO_2$: specific surface area 21 $m^2/g$), a zirconium oxide powder ($ZrO_2$: specific surface area 24 $m^2/g$), and a chromium oxide powder ($Cr_2O_3$: specific surface area 10 $m^2/g$) were prepared and weighed so that the composition as a piezoelectric ceramic base powder satisfied the formula below.

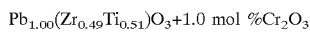

Next, the individual powders were pulverized and mixed using a ball mill, and a piezoelectric ceramic base powder (mixed base powder) was prepared. At this stage, the piezoelectric ceramic base powder had a specific surface area of 10 $m^2/g$.

The piezoelectric ceramic base powder thus obtained was then heated to 900° C. at a heating rate of 2° C./min, and the temperature was maintained at 900° C. for 2 hours to heat-treat (calcine) the piezoelectric ceramic base powder. The calcined powder was pulverized and a lead zirconate titanate-based ceramic powder containing, as a principal crystal, lead zirconate titanate was thereby obtained.

Next, a predetermined amount of binder was added to the lead zirconate titanate-based ceramic powder and granulation was performed. A square sheet with a side of 15 mm and a thickness of 1 mm was formed, and the green compact thus obtained was fired to produce a sintered compact. Furthermore, electrodes for polarization were formed on the resultant sintered compact, and polarization treatment was performed in a 60° C. insulating oil by applying 3,000 V for 60 minutes. A piezoelectric ceramic was thereby obtained.

A plurality of samples having the composition described above were prepared in order to investigate the reactions during the heat treatment (calcination) of the piezoelectric ceramic base powder thus obtained and the compounds produced in the heat treatment profile. The temperature was increased to a predetermined level, which was maintained for 3 minutes, and the XRD peak intensity ratio of each sample was measured. The measurement results thereof are shown in FIG. 1. The individual samples were tested under the same conditions except for the calcining temperature.

As a Comparative Example, the XRD peak intensity ratio was measured in the same manner as that described above apart from the fact that a titanium oxide powder ($TiO_2$: specific surface area 5 $m^2/g$) and a zirconium oxide powder ($ZrO_2$: specific surface area 24 $m^2/g$) were used. The measurement results thereof are shown in FIG. 2.

Figure 3:
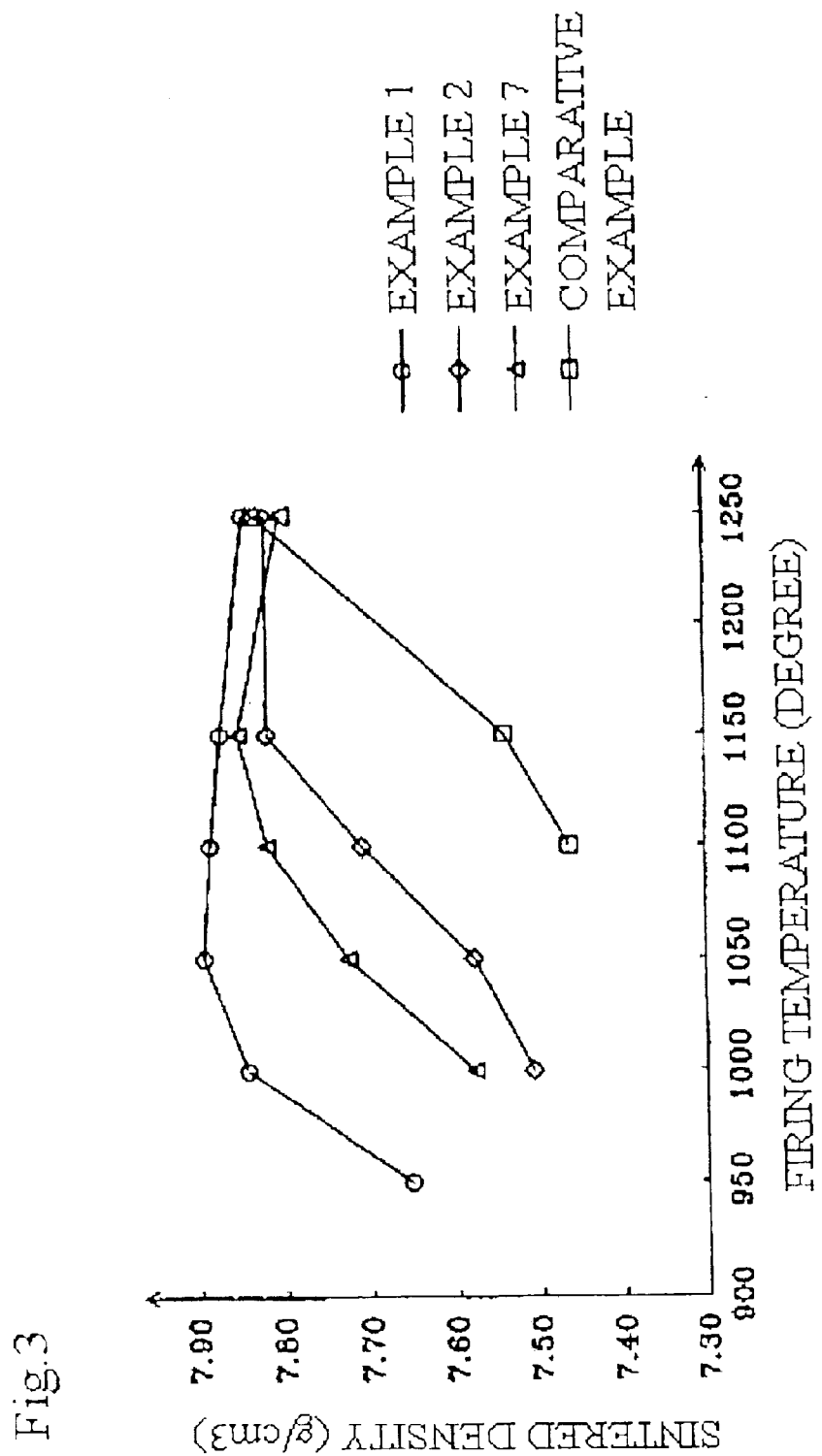
FIG. 3 is a graph showing the relationship between the firing temperature and the sintered density with respect to piezoelectric ceramics in Examples 1, 2, and 7 and the Comparative Example.
Figure 4:
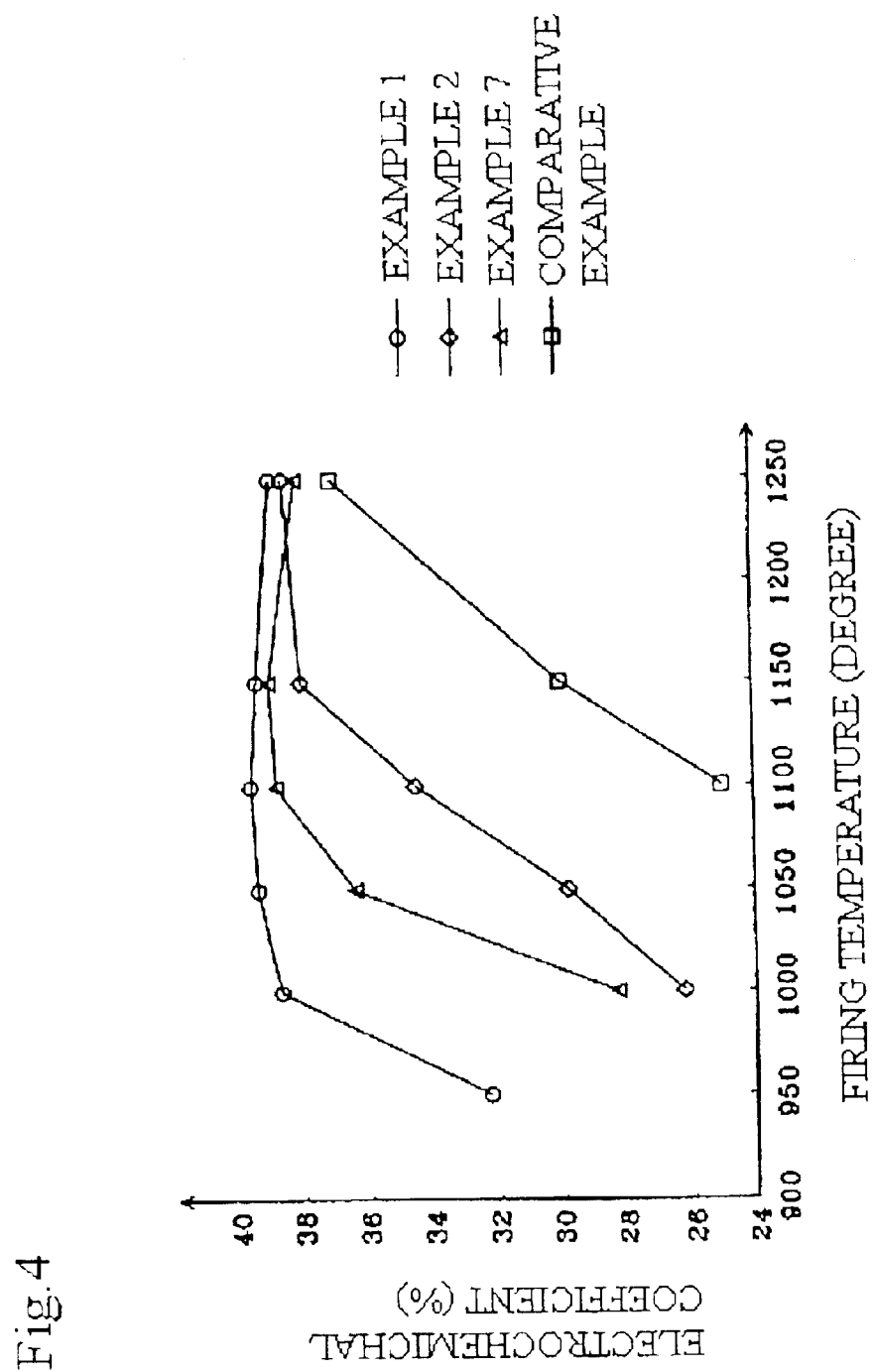
FIG. 4 is a graph showing the relationship between the sintering temperature and the electromechanical coefficient with respect to piezoelectric ceramics in Examples 1, 2, and 7, and the Comparative Example.

During the production of the piezoelectric ceramics, the firing temperature was varied, and the sintered density and the electromechanical coefficient were measured when firing was performed at each temperature for 3 hours. The results thereof are shown in FIGS. 3 and 4.

Figure 2:
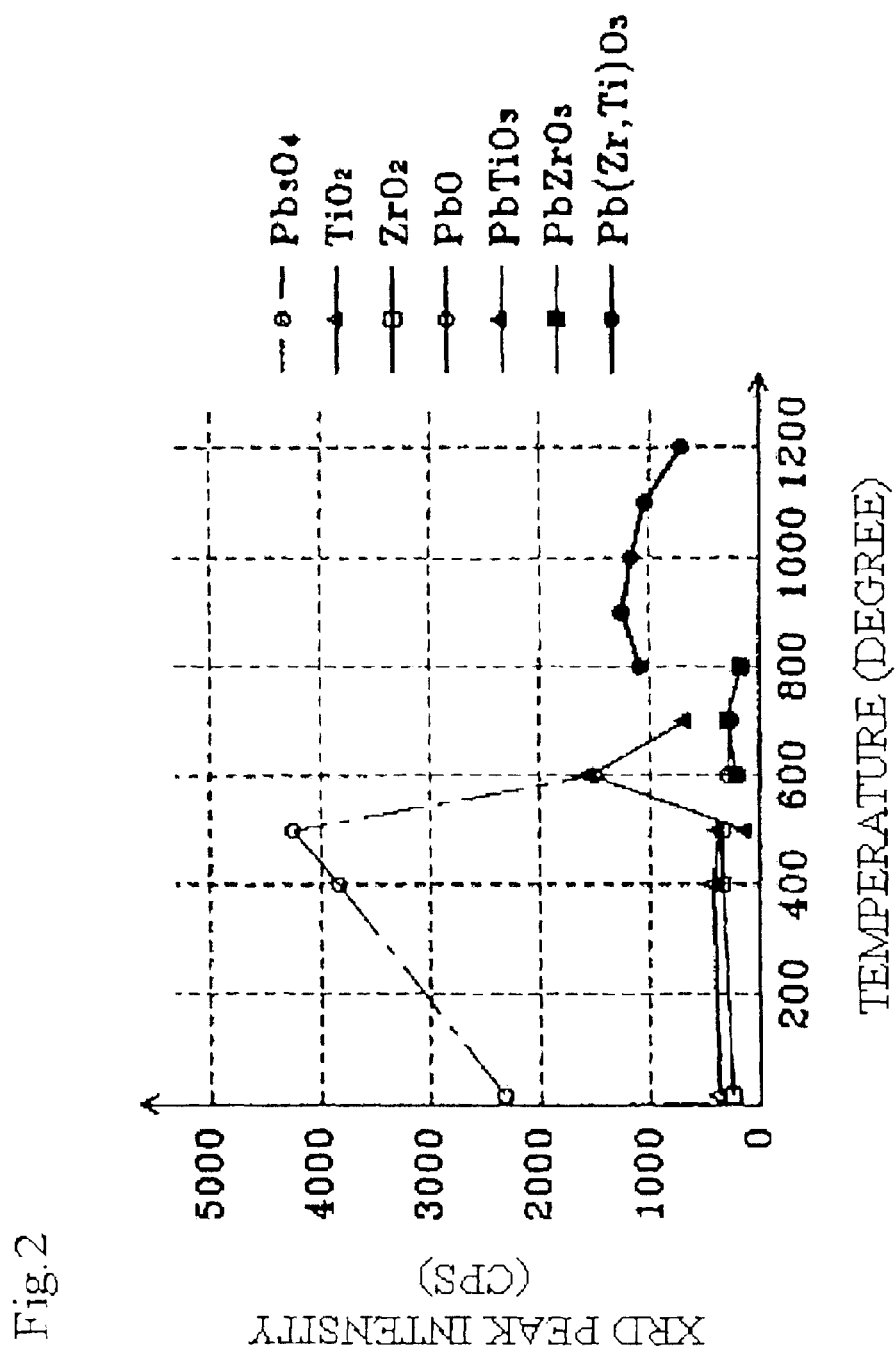
FIG. 2 is a graph showing the XRD peak intensity ratio of the individual compounds in a Comparative Example in the lead zirconate titanate synthesis process.

As shown in FIGS. 1 and 2, in the samples of the Comparative Example, the generation of $PbZrO_3$ was observed in the heat treatment profile. In contrast, in the samples of Example 1, the generation of $PbZrO_3$ was not observed in the firing profile.

Example 2

A lead oxide powder ($Pb_3O_4$: specific surface area 2 $m^2/g$), a titanium oxide powder ($TiO_2$: specific surface area 5 $m^2/g$), a zirconium oxide powder ($ZrO_2$: specific surface area 24 $m^2/g$), and a chromium oxide powder ($Cr_2O_3$: specific surface area 10 $m^2/g$) were prepared and weighed so that the composition as a piezoelectric ceramic material satisfied the formula below.

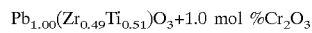

Next, the individual powders other than the zirconium oxide powder were pulverized and mixed using a ball mill, and a mixture was prepared. The mixture was heated to 700° C. at a heating rate of 2° C./min, the temperature was maintained at 700° C. for 2 hours to perform heat treatment (calcination), and thereby a mixed powder containing an unreacted lead oxide powder and a lead titanate-based powder containing lead titanate was prepared.

Next, the mixed powder was pulverized, and the zirconium oxide powder was added thereto. Heating was performed to 900° C. at a heating rate of 2° C./min, and the temperature was maintained at 900° C. for 2 hours to perform second heat treatment (calcination). The calcined powder was pulverized, and a lead zirconate titanate-based ceramic powder having lead zirconate titanate as the principal crystal was thereby obtained.

Next, a predetermined amount of binder was added to the lead zirconate titanate-based ceramic powder and granulation was performed. A square sheet with a side of 15 mm and a thickness of 1 mm was formed, and the green compact thus obtained was fired to produce a sintered compact. Furthermore, electrodes for polarization were formed on the resultant sintered compact, and polarization treatment was performed in a 60° C. insulating oil by applying 3,000 V for 60 minutes. A piezoelectric ceramic was thereby obtained.

With respect to the resultant piezoelectric ceramic, the sintered density and the electromechanical coefficient were measured in the same manner as Example 1, and the measurement results are also shown in FIGS. 3 and 4.

Example 3

In this example, with respect to piezoelectric ceramics having the same composition as Example 1, the specific surface areas of the titanium oxide powder and the zirconium oxide powder were varied. Using the titanium oxide powder and the zirconium oxide powder, the generation of lead zirconate in the lead zirconate titanate synthesis process was investigated, and furthermore, the electromechanical coefficient of the resultant piezoelectric ceramic was measured.

Additionally, the method of confirming the generation of lead zirconate in the lead zirconate titanate synthesis process and the method of producing the piezoelectric ceramic were the same as those in Example 1. The results thereof are shown in Table 1 and FIG. 5. For reference, Table 1 also shows the Comparative Example produced in Example 1.

TABLE 1

| Sample No. | Specific Surface Area of Starting Material (m²/g) ZrO₂ | TiO₂ | Generation of PbZrO₃ | Firing Temperature (° C.) | Electro-mechanical Coefficient (%) |
|---|---|---|---|---|---|
| 1 | 1 | 5 | No | 1150 | 36 |
| 2 | 12 | 21 | No | 1150 | 37 |
| 3 | 12 | 5 | No | 1150 | 38 |
| 4 | 12 | 52 | No | 1150 | 40 |
| 5 | 12 | 78 | No | 1150 | 42 |
| 6 | 12 | 111 | No | 1150 | 43 |
| 7 | 24 | 5 | Yes | 1150 | 30 |
| 8 | 24 | 21 | No | 1150 | 39 |
| 9 | 24 | 52 | No | 1150 | 42 |
| 10 | 24 | 78 | No | 1150 | 43 |
| 11 | 24 | 111 | No | 1150 | 44 |
| 12 | 32 | 21 | Yes | 1150 | 32 |
| 13 | 32 | 52 | No | 1150 | 44 |
| 14 | 32 | 78 | No | 1150 | 45 |
| 15 | 32 | 111 | No | 1150 | 46 |
| 16 | 38 | 52 | Yes | 1150 | 33 |
| 17 | 38 | 111 | No | 1150 | 46 |
| 18 | 50 | 21 | Yes | 1150 | 29 |
| 19 | 50 | 52 | Yes | 1150 | 31 |
| 20 | 50 | 78 | Yes | 1150 | 32 |
| 21 | 50 | 111 | Yes | 1150 | 34 |
| Comparative Example | 24 | 5 | Yes | 1250 | 37 |
| Example | 24 | 5 | Yes | 1100 | 25 |

Figure 5:
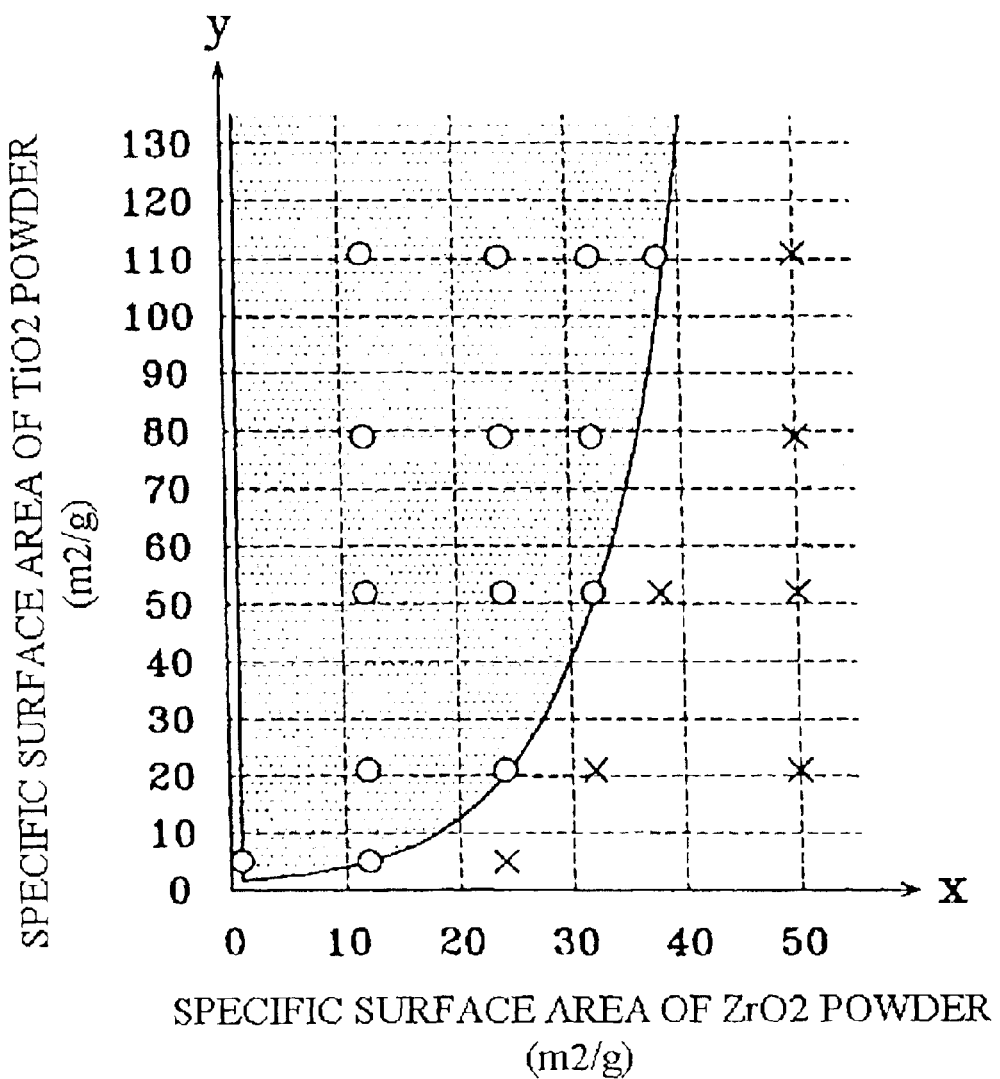
FIG. 5 is a graph showing the relationship between the specific surface area of titanium oxide powder and the specific surface area of zirconium oxide powder and the generation of lead zirconate in the lead zirconate titanate synthesis process.

As shown in Table 1 and FIG. 5, with respect to the samples in which the specific surface area x (m²/g) of the zirconium oxide powder and the specific surface area y (m²/g) of the titanium oxide powder satisfy the expressions $y \geq 1.218e^{0.117x}$ and $x \geq 1$, lead zirconate is not generated in the process of synthesizing lead zirconate titanate even if the titanium oxide powder and the zirconium oxide powder are simultaneously added to the lead oxide powder as starting materials and heat treatment calcination) is performed.

It is also confirmed that in the piezoelectric ceramic produced using the titanium oxide powder and the zirconium oxide powder in the range described above, the firing temperature can be decreased.

The reason for setting the relationship between the specific surface area x (m²/g) of the zirconium oxide powder and the specific surface area y (m²/g) of the titanium oxide powder so as to satisfy $y \geq 1.218e^{0.117x}$ and $x \geq 1$ will be described below.

The expression $y \geq 1.218e^{0.117x}$ was selected because, as in the piezoelectric ceramics of Sample Nos. 7, 12, 16, and 18 to 21, when the relationship between the specific surface area of the titanium oxide powder and the specific surface area of the zirconium oxide powder lay in the lower-right region of the graph showing $y=1.218e^{0.117x}$ in FIG. 4 ($y<1.218e^{0.117x}$), lead zirconate was generated in the process of synthesizing lead zirconate titanate, and the firing temperature of the piezoelectric ceramic tended to be increased.

The expression $x \geq 1$ was selected because even if the relationship between the specific surface area x (m²/g) of the zirconium oxide powder and the specific surface area y (m²/g) of the titanium oxide powder satisfied $y \geq 1.218e^{0.117x}$, if x<1, since the zirconium oxide powder as the starting material had coarse grains, the synthesis of lead zirconate titanate tended to be inhibited.

Example 4

A lead oxide powder (Pb₃O₄: specific surface area 2 m²/g), a titanium oxide powder (TiO₂: specific surface area 5 m²/g), a zirconium oxide powder (ZrO₂: specific surface area 24 m²/g), a niobium oxide powder (Nb₂O₅: specific surface area 5 m²/g), and a manganese carbonate powder (MnCO₃: specific surface area 20 m²/g) were prepared.

These powders were weighed so that the composition as a piezoelectric ceramic base powder satisfied the formula below.

$$Pb_{1.00}((Mn_{1/3}Nb_{2/3})_{0.10}Zr_{0.49}Ti_{0.41})O_3$$

The individual powders other than the zirconium oxide powder, as starting materials, were pulverized and mixed using a ball mill, and a mixture was prepared. The mixture was heated to 700° C. at a heating rate of 2° C./min, the temperature was maintained at 700° C. for 2 hours to perform heat treatment (calcination), and thereby a mixed powder containing an unreacted lead oxide powder and a lead titanate-based powder containing lead titanate was prepared.

Next, the mixed powder was pulverized, and the zirconium oxide powder was added thereto. Heating was performed to 900° C. at a heating rate of 2° C./min, and the temperature was maintained at 900° C. for 2 hours to perform a second heat treatment (calcination). The calcined powder was pulverized, and a lead zirconate titanate-based ceramic powder having lead zirconate titanate as the principal crystal was thereby obtained.

Next, a binder was added to the resultant lead zirconate titanate-based ceramic powder and granulation was performed. A square sheet with a side of 15 mm and a thickness of 1 mm was press-molded, and the green compact thus obtained was fired to produce a sintered compact. Furthermore, electrodes for polarization were formed on the resultant sintered compact, and polarization treatment was performed in a 60° C. insulating oil by applying 3,000 V for 60 minutes. A piezoelectric ceramic represented by Sample No. 23 was thereby obtained.

A piezoelectric ceramic represented by Sample No. 24 was produced in the same manner as described above, apart from the fact that the specific surface area of the zirconium oxide powder was 24 m²/g and the specific surface area of the titanium oxide powder was 21 m²/g.

Using the same starting materials and composition as those of the piezoelectric ceramic of Sample No. 23, a piezoelectric ceramic in Comparative Example 1 was also produced in the same manner as the piezoelectric ceramic of Sample No. 23, apart from the fact that all the starting materials were pulverized and mixed at once using a ball mill to produce a mixture, the mixture was heated to 900° C. at a heating rate of 2° C./min, the temperature was maintained at 900° C. for 2 hours to perform calcination, and pulverization was performed, and then a binder was added to the calcined powder, followed by granulation.

With respect to a piezoelectric ceramic (Sample No. 25) containing a magnesium hydroxide powder ($Mg(OH)_2$: specific surface area 20 $m^2/g$) and a niobium oxide powder ($Nb_2O_5$: specific surface area 5 $m^2/g$), a piezoelectric ceramic (Sample No. 26) containing a cobalt carbonate powder ($CoCO_3$: specific surface area 100 $m^2/g$) and a niobium oxide powder ($Nb_2O_5$: specific surface area 5 $m^2/g$), and a piezoelectric ceramic (sample No. 27) containing niobium oxide ($Nb_2O_5$: specific surface area 5 $m^2/g$) only, in addition to the lead oxide powder, the titanium oxide powder, and the zirconium oxide powder, excluding the manganese carbonate powder and the niobium oxide powder, as base materials, weighing was performed so as to satisfy the compositional formulae shown in Table 2 below, and the piezoelectric ceramics were produced in the same manner as Sample No. 23. A sample which did not contain Nb produced in Example 2 was considered as Comparative Example 2.

With respect to the piezoelectric ceramics of Sample Nos. 23 to 27, Comparative Example 1, and Comparative Example 2, the sintered density and the electromechanical coefficient (Kp) were measured when firing was performed at 1,100° C. for 3 hours. Furthermore, the occurrence of cracking in the resultant piezoelectric ceramics was visually observed. The evaluation results thereof are shown in Table 2 below.

phase were not substantially mixed, the resultant piezoelectric ceramics kept high sintered densities and had high electrochemical coefficients (Kp).

In contrast, with respect to Comparative Example 1 which contained Nb and in which the generation of lead zirconate was observed in the production process of lead zirconate titanate, the temperature at which the pyrochlore phase was decreased to the insignificant level was high. When sintering was performed, since the pyrochlore phase and the perovskite phase were substantially mixed, the sintered density and the electromechanical coefficient (Kp) were inferior to those of the piezoelectric ceramics of Sample Nos. 23 to 27, and cracking occurred in the sintered compact.

Example 5

As starting materials, a titanium oxide powder ($TiO_2$: specific surface area 21 $m^2/g$), a zirconium oxide powder ($ZrO_2$: specific surface area 24 $m^2/g$), a lead oxide powder ($Pb_3O_4$: specific surface area 2 $m^2/g$), a niobium oxide powder ($Nb_2O_5$: specific surface area 5 $m^2/g$), and a chromium oxide powder ($Cr_2O_3$: specific surface area 10 $m^2/g$) were prepared and weighed so that the composition as a piezoelectric ceramic base powder satisfied the formula below.

$$Pb_{1.00}\{(Cr_{1/3}Nb_{2/3})O_3Ti_{0.49}Zr_{0.48}\}O_3$$

Next, the individual powders were pulverized and mixed using a ball mill, and a piezoelectric ceramic base powder (mixed base powder) was prepared. At this stage, the piezoelectric ceramic base powder had a specific surface area of 10 $m^2/g$.

The piezoelectric ceramic base powder thus obtained was then heated to 900° C. at a heating rate of 2° C./min, and the temperature was maintained at 900° C. for 2 hours to

TABLE 2

| Sample No. | Compositional Formula | Specific Surface Area of Starting Material ($m^2/g$) | | Disappearing Temperature of Pyrochlore Phase (° C.) | Firing Temperature (° C.) | Sintered Density (g/cm³) | Electro-mechanical Coefficient (%) | Occurrence of Cracking of Sintered Compact (Calcining Temperature 1,000° C.) |
|---|---|---|---|---|---|---|---|---|
| | | $ZrO_2$ | $TiO_2$ | | | | | |
| 23 | $Pb_{1.00}((Mn_{1/3}Nb_{2/3})_{0.10}Zr_{0.49}Ti_{0.41})O_3$ | 24 | 5 | 1000 | 1100 | 7.83 | 40 | No |
| 24 | $Pb_{1.00}((Mn_{1/3}Nb_{2/3})_{0.10}Zr_{0.49}Ti_{0.41})O_3$ | 24 | 21 | 1000 | 1100 | 7.86 | 44 | No |
| 25 | $Pb_{1.00}((Mg_{1/3}Nb_{2/3})_{0.10}Zr_{0.49}Ti_{0.41})O_3$ | 24 | 5 | 900 | 1100 | 7.82 | 45 | No |
| 26 | $Pb_{1.00}((Co_{1/3}Nb_{2/3})_{0.10}Zr_{0.49}Ti_{0.41})O_3$ | 24 | 5 | 950 | 1100 | 7.85 | 51 | No |
| 27 | $Pb_{1.00}(Zr_{0.54}Ti_{0.46})O_3$ + 0.06 molNb | 24 | 5 | 950 | 1100 | 7.87 | 62 | No |
| Comparative Example 1 | $Pb_{1.00}((Mn_{1/3}Nb_{2/3})_{0.10}Zr_{0.49}Ti_{0.41})O_3$ | 24 | 5 | 1150 | 1100 | 7.63 | 35 | Yes |
| Comparative Example 2 | $Pb_{1.00}(Zr_{0.54}Ti_{0.46})O_3$ + 0.03 molMn | 24 | 5 | — | 1100 | 7.83 | 32 | No |

As is clear from Table 2, each of the piezoelectric ceramics of Sample Nos. 23 to 27 had a superior electromechanical coefficient (Kp) compared to the piezoelectric ceramic in Comparative Example 2 which did not contain Nb. In particular, when Nb was contained, with respect to the piezoelectric ceramics of Sample Nos. 23 to 27, the temperature at which the pyrochlore phase was decreased to the insignificant level was low, and since the pyrochlore phase was not substantially present when the perovskite phase was generated, cracking did not occur in the sintered compacts. That is, even when the firing temperature was as low as 1,100° C., since the pyrochlore phase and the perovskite perform heat treatment (calcination). The calcined powder was pulverized and a lead zirconate titanate-based ceramic powder containing, as a principal crystal, lead zirconate titanate was thereby obtained.

Next, a predetermined amount of binder was added to the lead zirconate titanate-based ceramic powder and granulation was performed. A square sheet with a side of 15 mm and a thickness of 1 mm was formed, and the green compact thus obtained was fired to produce a sintered compact. Furthermore, electrodes for polarization were formed on the resultant sintered compact, and polarization treatment was performed in a 60° C. insulating oil by applying 3,000 V for 60 minutes. A piezoelectric ceramic was thereby obtained.

Figure 6:
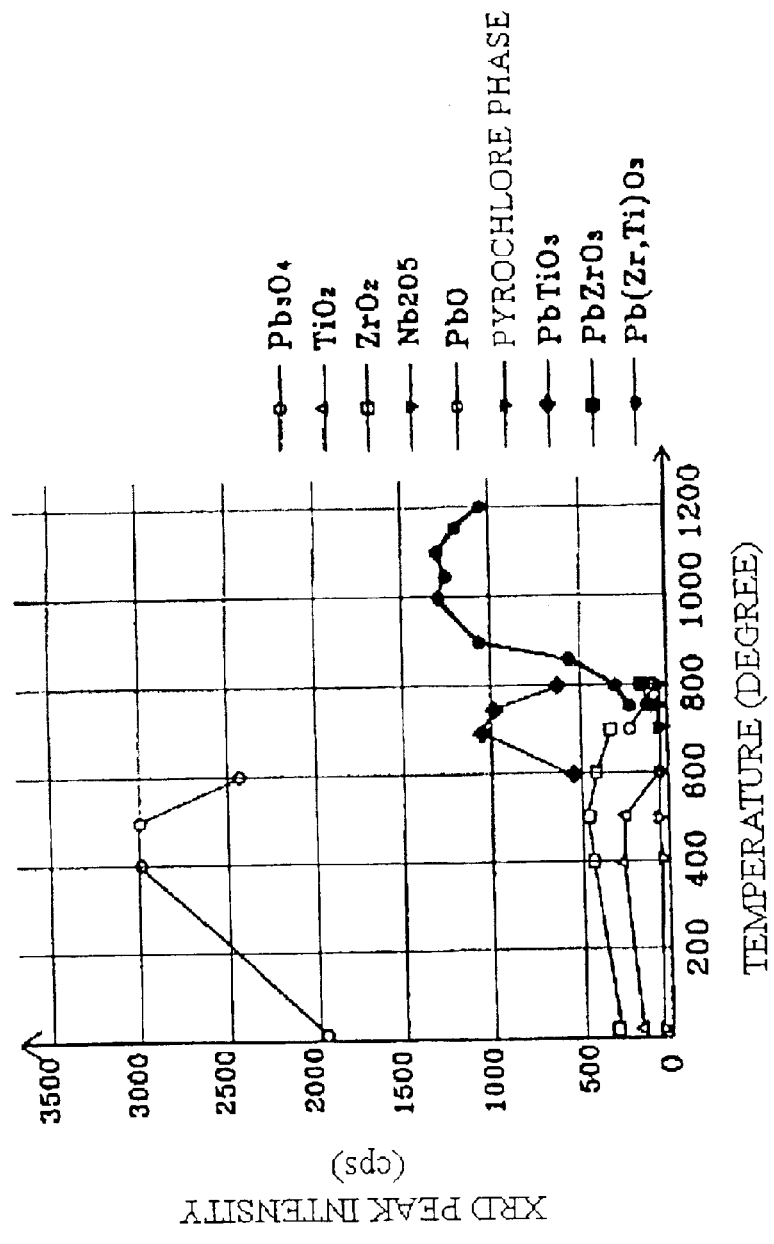
FIG. 6 is a graph showing the XRD peak intensity ratio of the individual compounds in Example 5 in the synthesis process of lead zirconate titanate to which niobium oxide powder is added.

A plurality of samples having the composition described above were prepared in order to investigate the reactions during the heat treatment (calcination) of the piezoelectric ceramic base powder thus obtained and the compounds produced in the heat treatment profile. The temperature was increased to a predetermined level, which was maintained for 3 minutes, and the XRD peak intensity ratio of each sample was measured. The measurement results thereof are shown in FIG. 6. The individual samples were tested under the same conditions except for the calcining temperature.

As a Comparative Example, a piezoelectric ceramic was produced in the same manner as that described above apart from the fact that a titanium oxide powder ($TiO_2$: specific surface area 5 $m^2/g$) and a zirconium oxide powder ($ZrO_2$: specific surface area 24 $m^2/g$) were used. The XRD peak intensity ratio of the piezoelectric ceramic was measured, and the results thereof are shown in FIG. 7.

In the Example shown in FIG. 6, although a slight amount of $PbZrO_3$ was generated, since the XRD peak intensity of lead zirconate was 0.4 times the XRD peak intensity of lead zirconate titanate, or less, which was insignificant, it was confirmed that lead zirconate titanate was generated from low temperatures. Although the pyrochlore phase was generated, it was generated only at an insignificant level at low temperatures.

Figure 7:
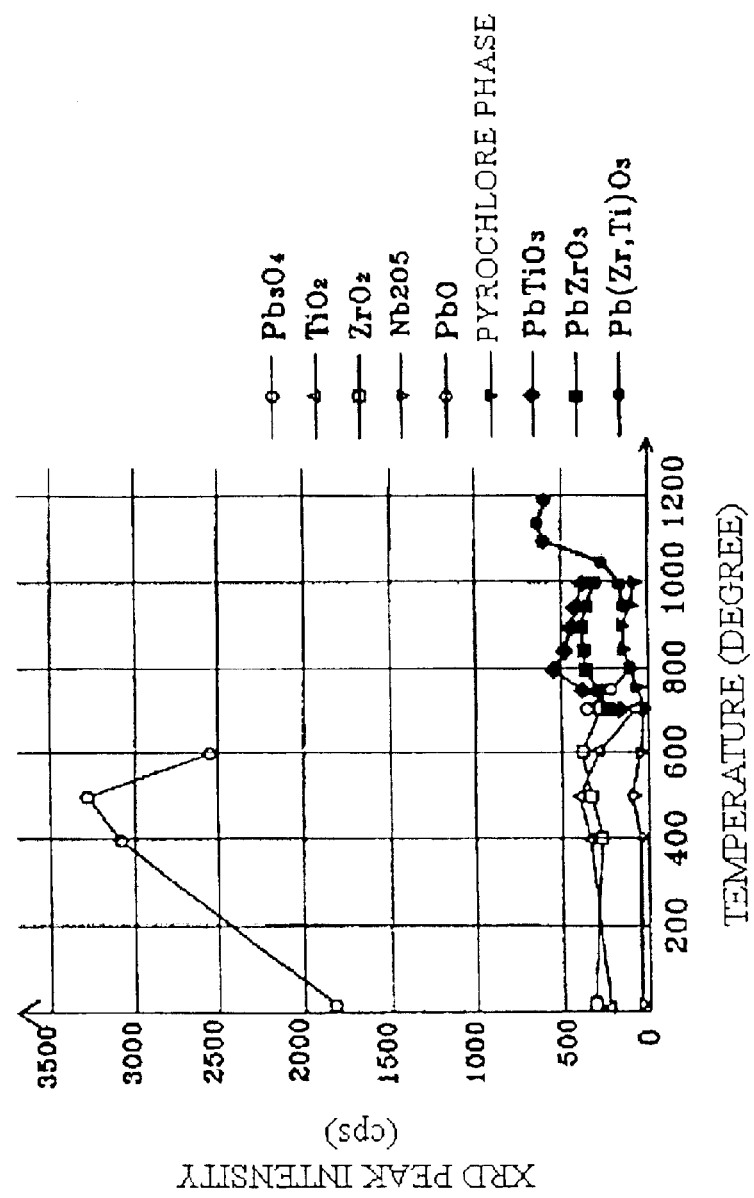
FIG. 7 is a graph showing the XRD peak intensity ratio of the individual compounds in a Comparative Example to Example 5 in the synthesis process of lead zirconate titanate to which niobium oxide powder is added.

In contrast, in the Comparative Example shown in FIG. 7, since $PbZrO_3$ was present up to a high temperature of 1,000° C., the temperature for synthesizing lead zirconate titanate was also increased. The pyrochlore phase was also present up to high temperatures.

Example 6

As starting materials, a titanium oxide powder ($TiO_2$: refer to Table 3 below for specific surface area), a zirconium oxide powder ($ZrO_2$: refer to Table 3 below for specific surface area), a lead oxide powder ($Pb_3O_4$: specific surface area 2 $m^2/g$), a niobium oxide powder ($Nb_2O_5$: specific surface area 5 $m^2/g$), and a chromium oxide powder ($Cr_2O_3$: specific surface area 10 $m^2/g$) were prepared and weighed so that the composition as a piezoelectric ceramic base powder satisfied the formula below.

$$Pb_{1.00}\{(Cr_{1/3}Nb_{2/3})_{0.3}Ti_{0.49}Zr_{0.48}\}O_3$$

Next, the individual powders were pulverized and mixed using a ball mill, and a piezoelectric ceramic base powder (mixed base powder) was prepared.

A sample containing a manganese carbonate powder ($MnCO_3$: specific surface area 20 $m^2/g$) and a niobium oxide powder ($Nb_2O_5$: specific surface area 5 $m^2/g$), a sample containing a magnesium hydroxide powder ($Mg(OH)_2$: specific surface area 20 $m^2/g$) and a niobium oxide powder ($Nb_2O_5$: specific surface area 5 $m^2/g$), and a sample containing a cobalt carbonate powder ($CoCO_3$: specific surface area 100 $m^2/g$) and a niobium oxide powder ($Nb_2O_5$: specific surface area 5 $m^2/g$), and a sample containing a niobium oxide powder ($Nb_2O_5$: specific surface area 5 $m^2/g$) only, in addition to the lead oxide powder, titanium oxide powder, and zirconium oxide powder, as starting materials, were prepared.

Furthermore, the titanium oxide powder and the zirconium oxide powder were prepared so as to satisfy the combinations shown in Table 3 below (Sample Nos. 36 to 58) and powders were weighed so as to satisfy the compositional formulae shown in Table 3, and pulverization and mixing were performed using a ball mill. Piezoelectric ceramic base powders were thereby prepared. The piezoelectric ceramic powders which were produced in this Example and which did not contain Nb as the starting material were considered as Comparative Examples.

A plurality of samples having the compositions described above were prepared and heated to predetermined temperatures, and the temperatures were maintained for 3 minutes. With respect to each sample, by measuring the XRD peak intensity of the pyrochlore phase (in the vicinity of 33° in XRD) and the XRD peak intensity of the perovskite phase (in the vicinity of 44° in XRD), the temperature at which the pyrochlore phase was decreased to the insignificant level was investigated.

Each piezoelectric ceramic base powder was heated at a heating rate of 2° C./min and was held at the temperature in which the pyrochlore phase was decreased to the insignificant level shown in Table 3 to perform heat treatment (calcination). The calcined powder was pulverized and a lead zirconate titanate-based ceramic powder containing, as a principal crystal, lead zirconate titanate was obtained. A binder was added to the lead zirconate titanate-based ceramic powder and granulation was performed. A square sheet with a side of 15 mm and a thickness of 1 mm was formed, and the green compact thus obtained was fired to produce a sintered compact. The sintered density and the electromechanical coefficient (Kp) of the resultant sintered compact were measured.

Furthermore, electrodes for polarization were formed on the resultant sintered compact, and polarization treatment was performed in a 60° C. insulating oil by applying 3,000 V for 60 minutes to produce a piezoelectric ceramic. The occurrence of cracking in the piezoelectric ceramic was visually observed.

Figure 8:
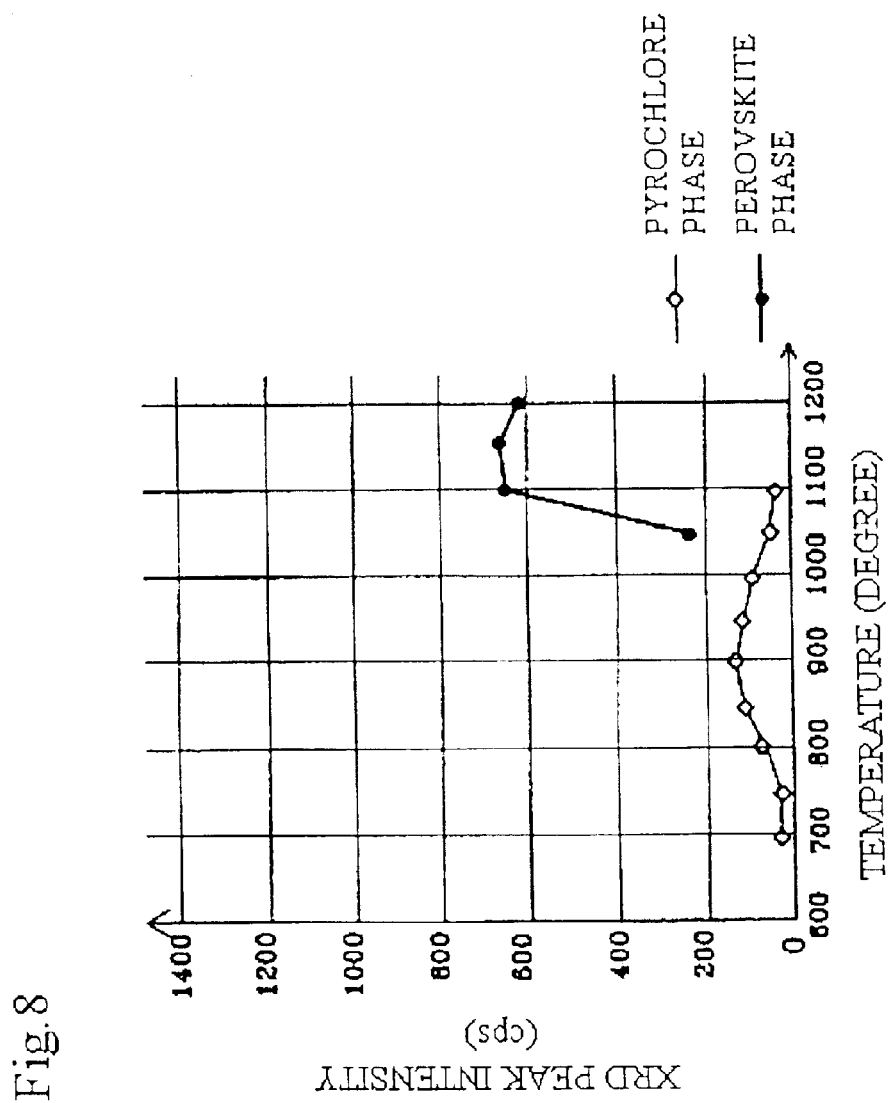
FIG. 8 is a graph showing the relationship between the XRD peak intensity and the calcining temperature with respect to the pyrochlore phase and the perovskite phase in Sample No. 40 in Example 6.
Figure 9:
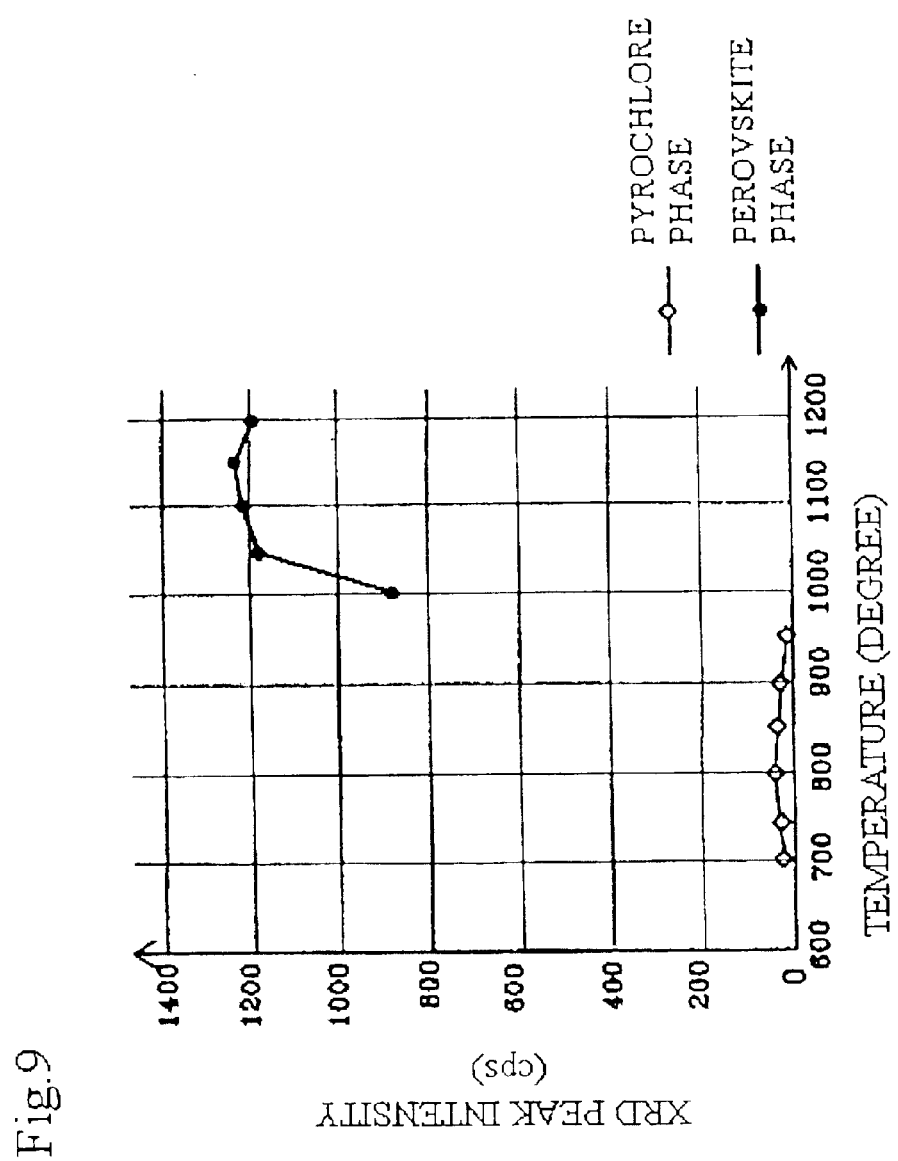
FIG. 9 is a graph showing the relationship between the XRD peak intensity and the calcining temperature with respect to the pyrochlore phase and the perovskite phase in Sample No. 41 in Example 6.

All the results thereof are shown in Table 3 below. In particular, with respect to the piezoelectric ceramics represented by Sample Nos. 40 and 41 among the samples containing manganese carbonate and niobium oxide as starting materials in addition to the lead oxide powder, the titanium oxide powder, and the zirconium oxide powder, the changes in the XRD peak intensity of the pyrochlore phase and the perovskite phase with temperature were investigated. The results thereof are shown in FIGS. 8 and 9.

TABLE 3

| Sample No. | Compositional Formula | Specific Surface Area of Starting Material ($m^2/g$) | | Disappearing Temperature of Pyrochlore Phase (° C.) | Firing Temperature (° C.) | Sintered Density (g/cm³) | Electro-mechanical Coefficient (%) | Occurrence of Cracking of Sintered Compact (Calcining Temperature 950° C.) |
|---|---|---|---|---|---|---|---|---|
| | | $ZrO_2$ | $TiO_2$ | | | | | |
| 28 | $Pb_{1.00}((Cr_{1/3}Nb_{2/3})_{0.03}Zr_{0.49}Ti_{0.48})O_3$ | 1 | 5 | 1000 | 1100 | 7.83 | 53 | No |
| 29 | $Pb_{1.00}((Cr_{1/3}Nb_{2/3})_{0.03}Zr_{0.49}Ti_{0.48})O_3$ | 24 | 5 | 1050 | 1100 | 7.78 | 48 | No |
| 30 | $Pb_{1.00}((Cr_{1/3}Nb_{2/3})_{0.03}Zr_{0.49}Ti_{0.48})O_3$ | 24 | 21 | 850 | 1100 | 7.85 | 54 | No |
| 31 | $Pb_{1.00}((Cr_{1/3}Nb_{2/3})_{0.03}Zr_{0.49}Ti_{0.48})O_3$ | 24 | 78 | 800 | 1100 | 7.87 | 56 | No |
| 32 | $Pb_{1.00}((Cr_{1/3}Nb_{2/3})_{0.03}Zr_{0.49}Ti_{0.48})O_3$ | 38 | 52 | 1050 | 1100 | 7.79 | 49 | No |

TABLE 3-continued

| Sample No. | Compositional Formula | Specific Surface Area of Starting Material (m²/g) ZrO₂ | TiO₂ | Disappearing Temperature of Pyrochlore Phase (° C.) | Firing Temperature (° C.) | Sintered Density (g/cm³) | Electro-mechanical Coefficient (%) | Occurrence of Cracking of Sintered Compact (Calcining Temperature 950° C.) |
|---|---|---|---|---|---|---|---|---|
| 33 | $Pb_{1.00}((Cr_{1/3}Nb_{2/3})_{0.03}Zr_{0.49}Ti_{0.48})O_3$ | 38 | 111 | 950 | 1100 | 7.88 | 57 | No |
| 34 | $Pb_{1.00}((Cr_{1/3}Nb_{2/3})_{0.03}Zr_{0.49}Ti_{0.48})O_3$ | 50 | 21 | 1050 | 1100 | 7.77 | 48 | No |
| 35 | $Pb_{1.00}((Cr_{1/3}Nb_{2/3})_{0.03}Zr_{0.49}Ti_{0.48})O_3$ | 50 | 78 | 1050 | 1100 | 7.80 | 50 | No |
| 36 | $Pb_{1.00}((Mn_{1/3}Nb_{2/3})_{0.10}Zr_{0.49}Ti_{0.41})O_3$ | 1 | 5 | 950 | 1100 | 7.82 | 41 | No |
| 37 | $Pb_{1.00}((Mn_{1/3}Nb_{2/3})_{0.10}Zr_{0.49}Ti_{0.41})O_3$ | 12 | 5 | 950 | 1100 | 7.83 | 41 | No |
| 38 | $Pb_{1.00}((Mn_{1/3}Nb_{2/3})_{0.10}Zr_{0.49}Ti_{0.41})O_3$ | 12 | 21 | 920 | 1100 | 7.85 | 42 | No |
| 39 | $Pb_{1.00}((Mn_{1/3}Nb_{2/3})_{0.10}Zr_{0.49}Ti_{0.41})O_3$ | 12 | 52 | 900 | 1100 | 7.86 | 43 | No |
| 40 | $Pb_{1.00}((Mn_{1/3}Nb_{2/3})_{0.10}Zr_{0.49}Ti_{0.41})O_3$ | 24 | 5 | 1150 | 1100 | 7.63 | — | Yes |
| 41 | $Pb_{1.00}((Mn_{1/3}Nb_{2/3})_{0.10}Zr_{0.49}Ti_{0.41})O_3$ | 24 | 21 | 1000 | 1100 | 7.85 | 42 | No |
| 42 | $Pb_{1.00}((Mn_{1/3}Nb_{2/3})_{0.10}Zr_{0.49}Ti_{0.41})O_3$ | 24 | 52 | 1000 | 1100 | 7.87 | 44 | No |
| 43 | $Pb_{1.00}((Mn_{1/3}Nb_{2/3})_{0.10}Zr_{0.49}Ti_{0.41})O_3$ | 32 | 21 | 1150 | 1100 | 7.65 | — | Yes |
| 44 | $Pb_{1.00}((Mn_{1/3}Nb_{2/3})_{0.10}Zr_{0.49}Ti_{0.41})O_3$ | 32 | 52 | 1050 | 1100 | 7.87 | 45 | No |
| 45 | $Pb_{1.00}((Mn_{1/3}Nb_{2/3})_{0.10}Zr_{0.49}Ti_{0.41})O_3$ | 32 | 78 | 950 | 1100 | 7.88 | 46 | No |
| 46 | $Pb_{1.00}((Mn_{1/3}Nb_{2/3})_{0.10}Zr_{0.49}Ti_{0.41})O_3$ | 38 | 52 | 1150 | 1100 | 7.65 | — | Yes |
| 47 | $Pb_{1.00}((Mn_{1/3}Nb_{2/3})_{0.10}Zr_{0.49}Ti_{0.41})O_3$ | 38 | 111 | 950 | 1100 | 7.89 | 46 | No |
| 48 | $Pb_{1.00}((Mn_{1/3}Nb_{2/3})_{0.10}Zr_{0.49}Ti_{0.41})O_3$ | 50 | 21 | 1150 | 1100 | 7.66 | — | Yes |
| 49 | $Pb_{1.00}((Mn_{1/3}Nb_{2/3})_{0.10}Zr_{0.49}Ti_{0.41})O_3$ | 50 | 52 | 1150 | 1100 | 7.66 | — | Yes |
| 50 | $Pb_{1.00}((Mn_{1/3}Nb_{2/3})_{0.10}Zr_{0.49}Ti_{0.41})O_3$ | 50 | 78 | 1100 | 1100 | 7.67 | — | Yes |
| 51 | $Pb_{1.00}((Mg_{1/3}Nb_{2/3})_{0.10}Zr_{0.49}Ti_{0.41})O_3$ | 24 | 5 | 950 | 1100 | 7.81 | 43 | No |
| 52 | $Pb_{1.00}((Mg_{1/3}Nb_{2/3})_{0.10}Zr_{0.49}Ti_{0.41})O_3$ | 24 | 21 | 900 | 1100 | 7.83 | 47 | No |
| 53 | $Pb_{1.00}((Co_{1/3}Nb_{2/3})_{0.10}Zr_{0.49}Ti_{0.41})O_3$ | 24 | 5 | 900 | 1100 | 7.82 | 49 | No |
| 54 | $Pb_{1.00}((Co_{1/3}Nb_{2/3})_{0.10}Zr_{0.49}Ti_{0.41})O_3$ | 24 | 21 | 850 | 1100 | 7.86 | 52 | No |
| 57 | $Pb_{1.00}(Zr_{0.54}Ti_{0.46})O_3 + 0.06\ molNb$ | 24 | 5 | 1000 | 1100 | 7.85 | 60 | No |
| 58 | $Pb_{1.00}(Zr_{0.54}Ti_{0.46})O_3 + 0.06\ molNb$ | 24 | 21 | 950 | 1100 | 7.88 | 64 | No |
| Comparative Example | $Pb_{1.00}(Zr_{0.54}Ti_{0.46})O_3 + 0.03\ molMn$ | 24 | 5 | — | 1100 | 7.83 | 32 | No |
| | $Pb_{1.00}(Zr_{0.54}Ti_{0.46})O_3 + 0.03\ molMn$ | 24 | 21 | — | 1100 | 7.86 | 35 | No |

As shown in Table 3, among the piezoelectric ceramics of Sample Nos. 28 to 58, in the sample in which the zirconium oxide powder and the titanium oxide powder satisfied the expression $y \geq 1.218e^{0.117x}$ ($x \geq 1$), where x is the specific surface area (m²/g) of the zirconium oxide powder and y is the specific surface area (m²/g) of the titanium oxide powder, the sintered density and the electromechanical coefficient were superior compared to the sample in which the expression was not satisfied. Even in the sample in which the expression was not satisfied among Sample Nos. 28 to 58, the sintered density and the electromechanical coefficient were superior in comparison with the Comparative Example which did not contain Nb.

With respect to the piezoelectric ceramics of Sample Nos. 28 to 35 containing the chromium oxide powder and the niobium oxide powder in addition to the lead oxide powder, the titanium oxide powder, and the zirconium oxide powder as starting materials, even if the pyrochlore phase was once generated in the heat treatment profile, since the pyrochlore phase disappeared before reaching the temperature at which the green compact started to be sintered and shrank, cracking did not occur in the sintered compact, and the pyrochlore phase disappeared at a very low temperature.

On the other hand, with respect to the piezoelectric ceramics of Sample Nos. 36 to 50 containing the manganese carbonate powder and the niobium oxide powder in addition to the lead oxide powder, the titanium oxide powder, and the zirconium oxide powder as starting materials, a large amount of the pyrochlore phase was generated, and since the pyrochlore phase remained even after reaching the temperature at which the green compact started to be sintered and shrank, cracking easily occurred.

However, in such a case, among the piezoelectric ceramics of Sample Nos. 36 to 50, in the sample in which the zirconium oxide powder and the titanium oxide powder satisfied the expression $y \geq 1.218e^{0.117x}$ ($x \geq 1$), where x is the specific surface area (m²/g) of the zirconium oxide powder and y is the specific surface area (m²/g) of the titanium oxide powder, since the temperature at which the pyrochlore phase was decreased to the insignificant level was low and the pyrochlore phase was not substantially present when the perovskite phase was generated, cracking did not occur in the sintered compact.

With respect to the sample in which the specific surface areas of zirconium oxide and titanium oxide did not satisfy the range described above, since the temperature at which the pyrochlore phase was decreased to the insignificant level was high at 1,100° C. or more, cracking was observed clearly in the piezoelectric ceramic.

With reference to FIGS. 8 and 9, in which the XRD peak intensity was measured under the same heating condition, with respect to the piezoelectric ceramic of Sample No. 41 in which the specific surface areas of zirconium oxide and titanium oxide satisfied the range described above, the pyrochlore phase was decreased to the insignificant level at a lower temperature than the piezoelectric ceramic of Sample No. 40 in which the range was not satisfied, and the pyrochlore phase and the perovskite phase were not substantially mixed.

Among the individual samples, in the sample in which the specific surface areas of zirconium oxide and titanium oxide satisfied the range described above, the temperature at which the pyrochlore phase was decreased to the insignificant level was lower than the sample in which the range was not satisfied, and the pyrochlore phase and the perovskite phase were not substantially mixed, and therefore, the sintered density was kept high and the electromechanical coefficient (Kp) was also high.

Example 7

With respect to the piezoelectric ceramic base powders (mixed base powders) in which the compositions and the specific surface areas of the titanium oxide powder and the zirconium oxide powder were according to Sample Nos. 7 and 12 in Example 3, the specific surface areas before pulverization were calculated.

Next, the specific surface areas of the piezoelectric ceramic base powders were varied by changing the duration of pulverization by a ball mill, and the specific surface areas after pulverization were measured. Furthermore, in the heat treatment process for synthesizing lead zirconate titanate using the piezoelectric ceramic base powders, the generation of lead zirconate was observed, and the electromechanical coefficients of the resultant piezoelectric ceramics were checked.

Additionally, the observation of lead zirconate in the heat treatment process for synthesizing lead zirconate titanate and the method for making the piezoelectric ceramic were performed in the same manner as in Example 1. The measurement results are shown in Table 5 below. With respect to the piezoelectric ceramic of Sample No. 60 in Table 5, the sintered density and the electromechanical coefficient were measured in the same manner as in Example 1 or 2, and the measurement results are also shown in FIGS. 3 and 4.

$x$ is the specific surface area ($m^2/g$) of the zirconium oxide powder and $y$ is the specific surface area ($m^2/g$) of the titanium oxide powder, the generation of lead zirconate was not observed in the heat treatment process for synthesizing lead zirconate titanate.

On the other hand, as in the piezoelectric ceramic of Sample No. 59 or 62, when the titanium oxide powder and the zirconium oxide powder did not satisfy the expression $y \geq 1.218e^{0.117x}$ ($x \geq 1$) and pulverization was not performed so as to make the specific surface area after pulverization 1.4 or more times the specific surface area before pulverization, lead zirconate was generated in the process of synthesizing lead zirconate titanate and it was not possible to decrease the firing temperature.

In the same manner as Example 1, when the firing temperature of the piezoelectric ceramic was varied, and firing was performed for 3 hours at each temperature, the sintered density and the electromechanical coefficient were measured. The measurement results are also shown in FIGS. 3 and 4.

As shown in FIGS. 3 and 4, with respect to the piezoelectric ceramic of this Example, since lead zirconate titanate was synthesized so as not to generate lead zirconate, a satisfactory electromechanical coefficient was achieved and the firing temperature was greatly decreased compared to the piezoelectric ceramic in which lead zirconate was generated during the synthesis of lead zirconate titanate.

TABLE 4

| Sample No. | Specific surface Area of Starting Material ($m^2/g$) | | Specific Surface Area before Pulverization ($m^2/g$) | Specific Surface Area after Pulverization ($m^2/g$) | Generation of $PbZrO_3$ | Firing Temperature (° C.) | Electromechanical Coefficient (%) |
|---|---|---|---|---|---|---|---|
| | $ZrO_2$ | $TiO_2$ | | | | | |
| 59 | 24 | 5 | 7 | 9 | Yes | 1250 | 33 |
| 60 | 24 | 5 | 7 | 10 | No | 1150 | 38 |
| 61 | 24 | 5 | 7 | 20 | No | 1150 | 42 |
| 62 | 32 | 21 | 10 | 12 | Yes | 1250 | 34 |
| 63 | 32 | 21 | 10 | 14 | No | 1150 | 40 |
| 64 | 32 | 21 | 10 | 25 | No | 1150 | 45 |

As shown in Table 4, with respect to the sample in which the piezoelectric ceramic base powder was pulverized so that the specific surface area after pulverization was 1.4 or more times the specific surface area before pulverization, even if the titanium oxide powder and the zirconium oxide powder were simultaneously added to the lead oxide powder and heat treatment (calcination) was performed, in the heat treatment process for synthesizing lead zirconate titanate, lead zirconate was not generated. It is also seen that, with respect to the piezoelectric ceramic produced using the piezoelectric ceramic base powder in which the specific surface area after pulverization was in the range described above, the firing temperature was decreased, and a high electromechanical coefficient was obtained.

Additionally, with respect to the sample in which the piezoelectric ceramic base powder was pulverized so that the specific surface area after pulverization was 1.4 or more times the specific surface area before pulverization, even if the titanium oxide powder and the zirconium oxide powder did not satisfy the expression $y \geq 1.218e^{0.117x}$ ($x \geq 1$), where

Example 8

Figure 10:
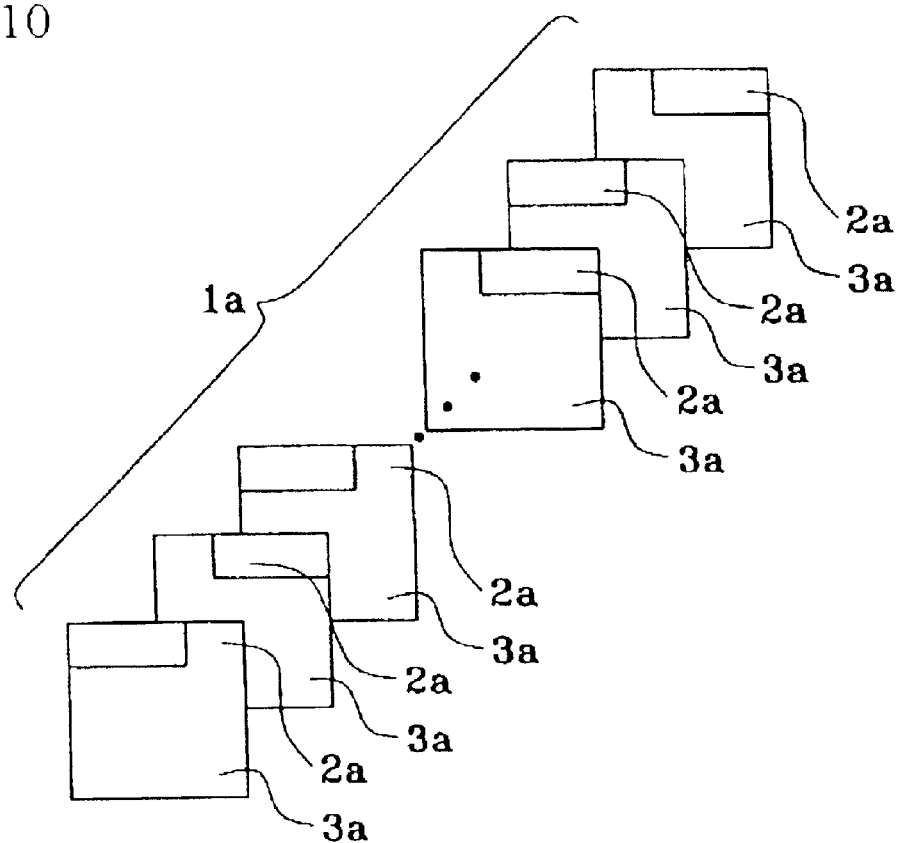
FIG. 10 is an assembly view showing a laminate constituting a piezoelectric filter in Example 8.
Figure 11:
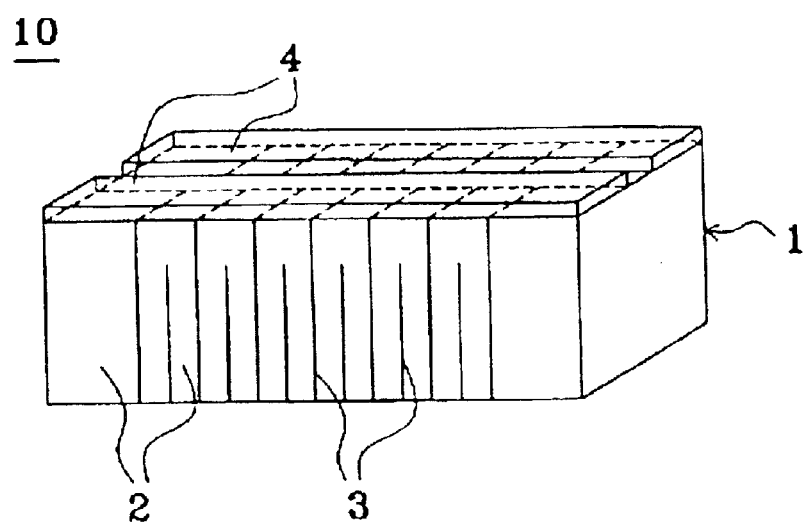
FIG. 11 is a perspective view which schematically shows a piezoelectric filter in Example 8.

A piezoelectric filter will now be described as an example of a piezoelectric ceramic element of the present invention. FIG. 10 is an assembly view showing a laminate constituting a piezoelectric filter in this Example, and FIG. 11 is a perspective view which schematically shows the piezoelectric filter in this Example.

First, as starting materials, a lead oxide powder ($Pb_3O_4$: specific surface area 2 $m^2/g$), a titanium oxide powder ($TiO_2$: specific surface area 78 $m^2/g$), a zirconium oxide powder ($ZrO_2$: specific surface area 32 $m^2/g$), a chromium oxide powder ($Cr_2O_3$: specific surface area 10 $m^2/g$), and an antimony oxide powder ($Sb_2O_3$: specific surface area 10 $m^2/g$) were prepared and weighed so that the composition as a piezoelectric ceramic base powder satisfied the formula below.

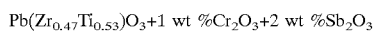

$Pb(Zr_{0.47}Ti_{0.53})O_3 + 1$ wt % $Cr_2O_3 + 2$ wt % $Sb_2O_3$

Wet mixing was performed using a ball mill, and a piezoelectric ceramic base powder (mixed base powder) was thereby produced.

Next, the piezoelectric ceramic base powder was heat-treated at 850° C. for 2 hours, and a lead zirconate titanate-based ceramic powder containing, as a principal crystal, lead zirconate titanate was obtained. A binder and a solvent were added to the resultant lead zirconate titanate-based ceramic powder to prepare a ceramic slurry. The ceramic slurry was formed into sheets, followed by drying. Ceramic green sheets were thereby formed.

As shown in FIG. 10, a laminate 1a was formed by laminating ceramic green sheets 2a on which internal electrode patterns 3a, having suitable shapes, were printed using an electrode paste. The laminate 1a was fired at 1,050° C. for 3 hours, and a laminated sintered compact was obtained. Electrodes for polarization (not shown) were formed on the surfaces of the laminated sintered compact so as to be connected to the internal electrodes, and polarization treatment was performed in a 60° C. insulating oil for 1 hour. By cutting the laminated sintered compact into a predetermined size, a piezoelectric filter was obtained.

As shown in FIG. 11, in a piezoelectric filter 10 thus obtained, piezoelectric ceramic layers 2 and internal electrode layers 3 were alternately laminated, and a laminated sintered compact 1 was formed in the shape of a substantially rectangular parallelepiped. The individual internal electrode layers 3 were exposed on the same lateral face of the laminated sintered compact 1, and two external electrodes 4 were formed in the longitudinal direction so as to be electrically connected to the individual internal electrode layers 3.

In accordance with the piezoelectric filter in this Example, a piezoelectric filter having a large filter bandwidth can be obtained.

Example 9

Figure 12:
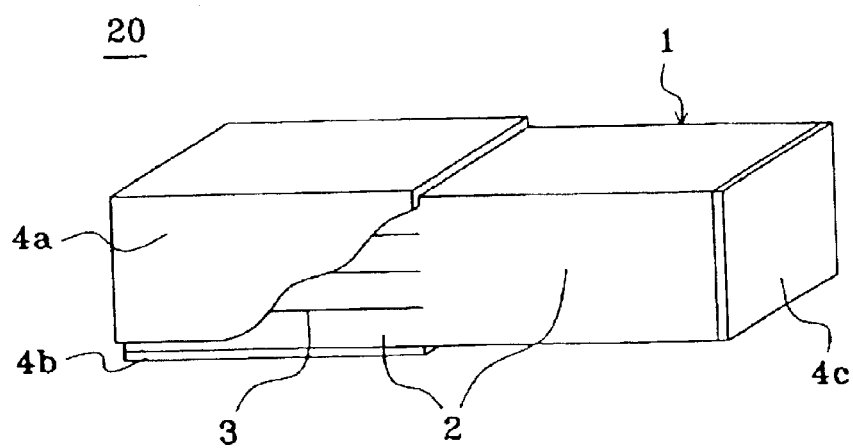
FIG. 12 is a partially cut-away perspective view showing a piezoelectric transformer in Example 9.

A piezoelectric transformer will now be described as another example of a piezoelectric ceramic element of the present invention. FIG. 12 is a partially cut-away perspective view showing a piezoelectric transformer in this Example.

First, as starting materials, a lead oxide powder ($Pb_3O_4$: specific surface area 2 m²/g), a titanium oxide powder ($TiO_2$: specific surface area 52 m²/g), a zirconium oxide powder ($ZrO_2$: specific surface area 24 m²/g), a tin oxide powder ($SnO_2$: specific surface area 5 m²/g), and an antimony oxide powder ($Sb_2O_3$: specific surface area 10 m²/g) were prepared and weighed so that the composition as a piezoelectric ceramic base powder satisfied the formula below.

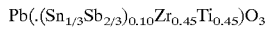

$Pb(.(Sn_{1/3}Sb_{2/3})_{0.10}Zr_{0.45}Ti_{0.45})O_3$

Wet mixing was performed using a ball mill, and a piezoelectric ceramic base powder (mixed base powder) was thereby produced.

Next, the piezoelectric ceramic base powder was heat-treated at 800° C. for 2 hours, and a lead zirconate titanate-based ceramic powder containing, as a principal crystal, lead zirconate titanate was obtained. A binder and a solvent were added to the resultant lead zirconate titanate-based ceramic powder to prepare a ceramic slurry. The ceramic slurry was formed into rectangular sheets, followed by drying. Ceramic green sheets were thereby formed.

The ceramic green sheets were laminated to form a laminate, in which an internal electrode paste was printed on one end of each ceramic green sheet so as to be exposed at both the front and back sides of the laminate as seen in FIG. 12, and the laminate was fired at 1,060° C. for 3 hours. A laminated sintered compact 1 including piezoelectric ceramic layers 2 and internal electrodes 3 was thereby obtained.

Next, a first external electrode 4a was formed at least on the front and back sides of the laminated sintered compact 1 so as to be connected to the individual internal electrodes 3 and preferably on the top side as well. A second external electrode 4b was formed on the bottom side as seen in FIG. 12. Furthermore, a third external electrode 4c was formed on an end opposite, in the longitudinal direction, to the end on which the first external electrode 4a and the second external electrode 4b were placed.

Next, polarization treatment was performed in the thickness direction between the first external electrode 4a and the second external electrode 4b, and then polarization was performed in the longitudinal direction between the third external electrode 4c and the first and second external electrodes 4a and 4b. A piezoelectric transformer 20 was thereby produced.

For comparison, a piezoelectric transformer in which titanium oxide ($TiO_2$: specific surface area 5 m²/g) and zirconium oxide ($ZrO_2$: specific surface area 24 m²/g) were used as starting materials was prepared, and the temperature increase due to heat-generation at an output of 6 W was measured.

As a result, in the comparative piezoelectric transformer, the increase in temperature due to heat generation was 50° C., while, in the piezoelectric transformer in this Example, the increase in temperature due to heat generation was 37° C., and thus the increase in temperature was reduced by 26%. That is, in this Example, a piezoelectric transformer having superior heat-generating characteristics was achieved.

Example 10

Figure 13:
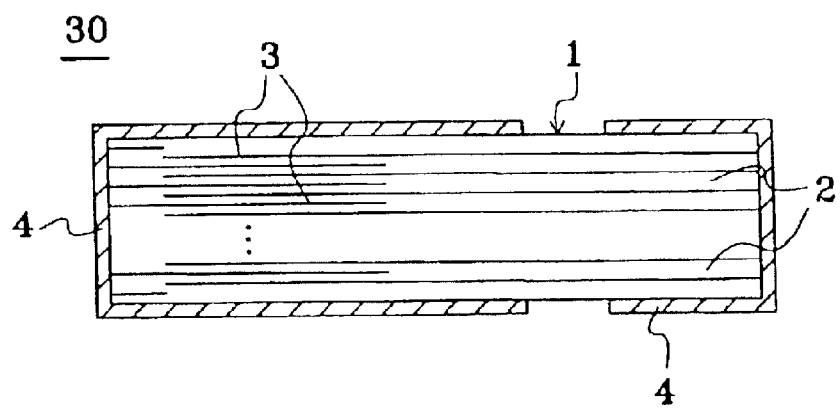
FIG. 13 is a sectional view which schematically shows a piezoelectric actuator in Example 10.

A piezoelectric actuator will now be described as a further example of a piezoelectric ceramic element of the present invention. FIG. 13 is a sectional view which schematically shows a piezoelectric actuator in this Example.

First, as starting materials, a lead oxide powder ($Pb_3O_4$: specific surface area 2 m²/g), a titanium oxide powder ($TiO_2$: specific surface area 21 m²/g), a zirconium oxide powder ($ZrO_2$: specific surface area 12 m²/g), and a strontium carbonate powder ($SrCO_3$: specific surface area 5 m²/g) were prepared and weighed so that the composition as a piezoelectric ceramic base powder satisfied the formula below.

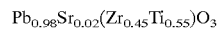

$Pb_{0.98}Sr_{0.02}(Zr_{0.45}Ti_{0.55})O_3$

Wet mixing was performed using a ball mill, and a piezoelectric ceramic base powder (mixed base powder) was thereby prepared.

Next, the piezoelectric ceramic base powder was heat-treated at 800° C. for 2 hours, and a lead zirconate titanate-based ceramic powder containing, as a principal crystal, lead zirconate titanate was obtained. A binder and a solvent were added to the resultant lead zirconate titanate-based ceramic powder to prepare a ceramic slurry. The ceramic slurry was formed into sheets, followed by drying. Ceramic green sheets were thereby formed.

Next, the ceramic green sheets were laminated to form a laminate, in which an internal electrode paste with a desired pattern was printed on each ceramic green sheet. The laminate was fired at 1,020° C. for 3 hours, and a laminated sintered compact in which piezoelectric ceramic layers and internal electrode layers were laminated was produced. Furthermore, electrodes for polarization (not shown) were formed on the surfaces of the laminated sintered compact so as to be connected to the internal electrodes, and polarization treatment was performed in a 60° C. insulating oil for 1 hour. By cutting the laminated sintered compact into a predetermined size, a piezoelectric actuator was obtained.

As shown in FIG. 13, in a piezoelectric actuator 30 of the present invention, piezoelectric ceramic layers 2 and internal electrodes 3 were alternately laminated, and the internal electrodes 3 were exposed on the two opposing ends of the laminated sintered compact 1 so that adjacent internal electrodes 3 were exposed on different ends, and each individual internal electrode 3 was electrically connected to one of external electrodes 4 formed on the opposing ends.

For comparison, a piezoelectric actuator in which a titanium oxide powder (TiO$_2$: specific surface area 21 m$^2$/g) and a zirconium oxide powder (ZrO$_2$: specific surface area 32 m$^2$/g) were used as starting materials was prepared, and the piezoelectric constant d$_{31}$ was measured with respect to the piezoelectric actuator in this Example and the comparative piezoelectric actuator.

As a result of measurement, in the comparative piezoelectric actuator, the piezoelectric constant d$_{31}$ was 200×10$^{-12}$/mV, while, in the piezoelectric actuator in this Example, the piezoelectric constant d$_{31}$ was 210×10$^{-12}$/mV, and thus an improvement of 5% in the piezoelectric constant was achieved. That is, in this Example, a piezoelectric actuator having a large displacement was achieved.

INDUSTRIAL APPLICABILITY

In accordance with the method for producing a lead zirconate titanate-based ceramic powder of the present invention, since the generation of lead zirconate can be suppressed in the lead zirconate titanate synthesis process, the amount of unreacted lead oxide being present at the grain boundaries can be decreased, and a lead zirconate titanate-based ceramic powder having a uniform, fine crystal structure and superior reactivity can be obtained.

In accordance with the method for making a piezoelectric ceramic of the present invention, since the lead zirconate titanate-based ceramic powder having a uniform, fine crystal structure and superior reactivity is used, the firing temperature for firing the ceramic powder can be kept low, and it is possible to obtain a piezoelectric ceramic which has a decreased variation in the composition ratio, stable quality, and a large electromechanical coefficient.

Although the present invention has been described in relation to particular embodiments thereof, many other variations and modifications and other uses will become apparent to those skilled in the art. Therefore, the present invention is not limited by the specific disclosure herein.

What is claimed is:

1. A method for making a lead zirconate titanate-based ceramic powder comprising:
   providing a mixed base powder comprising a lead oxide powder, a zirconium oxide powder, and a titanium oxide powder; and
   hear-treating the mixed base powder so that lead oxide in the lead oxide powder and titanium oxide in the titanium oxide powder react to produce lead titanate, and also so that unreacted lead oxide not used in the reaction, the lead titanate produced by the reaction, and zirconium oxide in the zirconium oxide powder react to produce the lead zirconate titanate-based ceramic powder containing lead zirconate titanate.

2. A method for making a lead zirconate titanate-based ceramic powder according to claim 1, wherein the zirconium oxide powder and the titanium oxide powder satisfy the expression y≧1.218e$^{0.117x}$ (x≧1), where x is the specific surface area (m$^2$/g) of the zirconium oxide powder and y is the specific surface area (m$^2$/g) of the titanium oxide powder.

3. A method for making a lead zirconate titanate-based ceramic powder according to claim 1, wherein, before heat-treating the mixed base powder, a niobium oxide powder is added to the mixed base powder.

4. A method for making a lead zirconate titanate-based ceramic powder according to claim 1, further comprising, before heat-treating the mixed base powder, pulverizing the mixed base powder so that the specific surface area after pulverization is 1.4 or more times the specific surface area before pulverization.

5. A method for making a lead zirconate titanate-based ceramic powder comprising:
   heat-treating a mixture of a lead oxide powder and a titanium oxide powder so that lead oxide in the lead oxide powder and titanium oxide in the titanium oxide powder react to produce a lead titanate-based powder containing lead titanate; and
   mixing and heat-treating the lead titanate-based powder, a lead oxide powder, and a zirconium oxide powder so that lead titanate in the lead titanate-based powder, lead oxide in the other lead oxide powder, and zirconium oxide in the zirconium oxide powder react to produce the lead zirconate titanate-based ceramic powder containing lead zirconate titanate.

6. A method for making a lead zirconate titanate-based ceramic powder according to claim 5, wherein the mixture of the lead oxide powder and the titanium oxide powder further comprises a niobium oxide powder.

7. A method for making a lead zirconate titanate-based ceramic powder according to claim 5, wherein, in the mixing and heat-treating, a niobium oxide powder is added and mixed together with the lead titanate-based powder, the lead oxide powder, and the zirconium oxide powder.

8. A method for making a piezoelectric ceramic comprising:
   providing a mixed base powder comprising a lead oxide powder, a zirconium oxide powder, and a titanium oxide powder;
   heat-treating the mixed base powder so that lead oxide in the lead oxide powder and titanium oxide in the titanium oxide powder react to produce lead titanate, and also so that unreacted lead oxide not used in the reaction, the lead titanate produced by the reaction, and zirconium oxide in the zirconium oxide powder react to produce a lead zirconate titanate-based ceramic powder containing lead zirconate titanate; and
   forming the lead zirconate titanate-based ceramic powder into a green compact having a predetermined shape and firing the green compact to obtain a sintered compact.

9. A method for making a piezoelectric ceramic according to claim 8, further comprising subjecting the sintered compact obtained by said firing to a polarization treatment.

10. A method for making a piezoelectric ceramic according to claim 8, wherein the zirconium oxide powder and the titanium oxide powder satisfy the expression y≧1.218e$^{0.117x}$ (x≧1), where x is the specific surface area (m$^2$/g) of the zirconium oxide powder and y is the specific surface area (m$^2$/g) of the titanium oxide powder.

11. A method for making a piezoelectric ceramic according to claim 8, wherein the mixed base powder provided further comprises a niobium oxide powder.

12. A method for making a piezoelectric ceramic according to claim 8, further comprising, before the heat-treating the mixed base powder, pulverizing the mixed base powder so that the specific surface area after pulverization is 1.4 or more times the specific surface area before pulverization.

13. A method for making a piezoelectric ceramic comprising:

heat-treating a mixture comprising a lead oxide powder and a titanium oxide powder so that lead oxide in the lead oxide powder and titanium oxide in the titanium oxide powder react to produce a lead titanate-based powder containing lead titanate;

mixing and heat-treating the lead titanate-based powder, a lead oxide powder, and a zirconium oxide powder so that lead titanate in the lead titanate-based powder, lead oxide in the other lead oxide powder, and zirconium oxide in the zirconium oxide powder react to produce a lead zirconate titanate-based ceramic powder containing lead zirconate titanate; and forming the lead zirconate titanate ceramic powder into a green compact having a predetermined shape and firing the green compact to obtain a sintered compact.

14. A method for making a piezoelectric ceramic according to claim 13, further comprising subjecting the sintered compact obtained by said firing to a polarization treatment.

15. A method for making a piezoelectric ceramic according to claim 13, wherein, in the mixture of the lead oxide powder and the titanium oxide powder further comprises a niobium oxide powder.

16. A method for making a piezoelectric ceramic according to claim 13, wherein, in the mixing and heat-treating, a niobium oxide powder is added and mixed together with the lead titanate-based powder, the lead oxide powder, and the zirconium oxide powder.

* * * * *